(12) United States Patent
Kubo

(10) Patent No.: US 10,720,525 B2
(45) Date of Patent: Jul. 21, 2020

(54) SEMICONDUCTOR DEVICE

(71) Applicant: ROHM CO., LTD., Kyoto-shi, Kyoto (JP)

(72) Inventor: Yusuke Kubo, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/357,823

(22) Filed: Mar. 19, 2019

(65) Prior Publication Data
US 2019/0305130 A1    Oct. 3, 2019

(30) Foreign Application Priority Data

Mar. 29, 2018 (JP) .................. 2018-064794

(51) Int. Cl.
| | |
|---|---|
| *H01L 29/78* | (2006.01) |
| *H01L 29/06* | (2006.01) |
| *H01L 29/40* | (2006.01) |
| *H01L 29/66* | (2006.01) |
| *H01L 29/36* | (2006.01) |
| *H01L 29/16* | (2006.01) |
| *H01L 29/08* | (2006.01) |
| *H01L 29/10* | (2006.01) |

(52) U.S. Cl.
CPC ...... *H01L 29/7827* (2013.01); *H01L 29/0634* (2013.01); *H01L 29/0696* (2013.01); *H01L 29/0847* (2013.01); *H01L 29/1033* (2013.01); *H01L 29/16* (2013.01); *H01L 29/36* (2013.01); *H01L 29/407* (2013.01); *H01L 29/66666* (2013.01)

(58) Field of Classification Search
CPC .......... H01L 29/7827; H01L 29/66666; H01L 29/407; H01L 29/1095; H01L 29/66431; H01L 29/66462; H01L 29/778; H01L 2924/13064
See application file for complete search history.

(56) References Cited

U.S. PATENT DOCUMENTS

2016/0133742 A1* 5/2016 Okuda .............. H01L 23/49555
257/330

FOREIGN PATENT DOCUMENTS

WO    2010024433 A1    3/2010

\* cited by examiner

*Primary Examiner* — Hsien Ming Lee
(74) *Attorney, Agent, or Firm* — Gregory M. Howison

(57) ABSTRACT

A semiconductor device includes: a semiconductor layer of a first conductive type having a first surface and a second surface opposite to the first surface; a body region of a second conductive type selectively formed on the first surface of the semiconductor layer; a source region of the first conductive type formed inside the body region; a gate electrode opposing part of the body region via a gate insulating film; a column layer of the second conductive type formed at the second surface side with respect to the body region; an embedded electrode embedded in the column layer such that the embedded electrode is electrically isolated from the column layer; and a first electrode electrically connected to the embedded electrode.

12 Claims, 19 Drawing Sheets

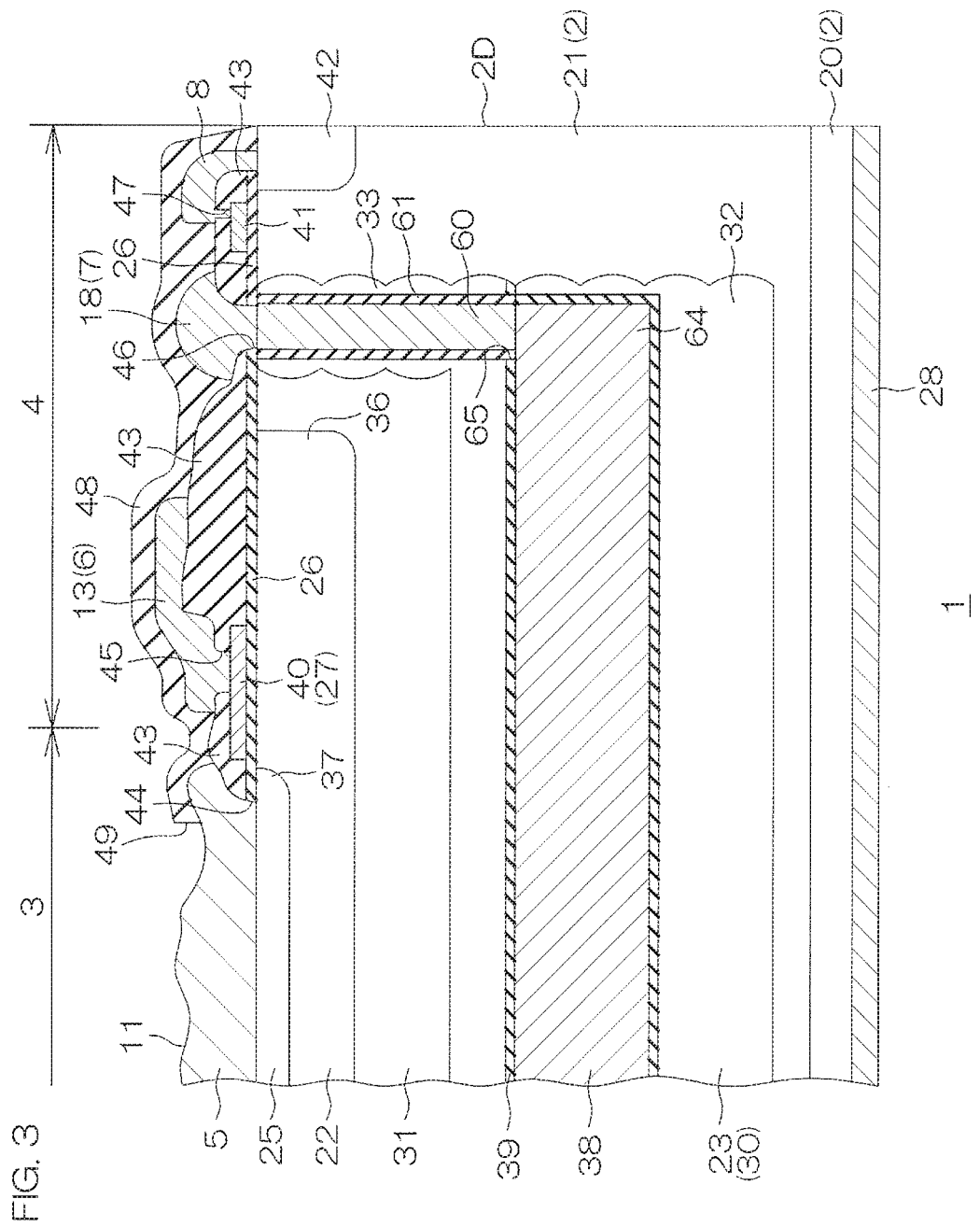

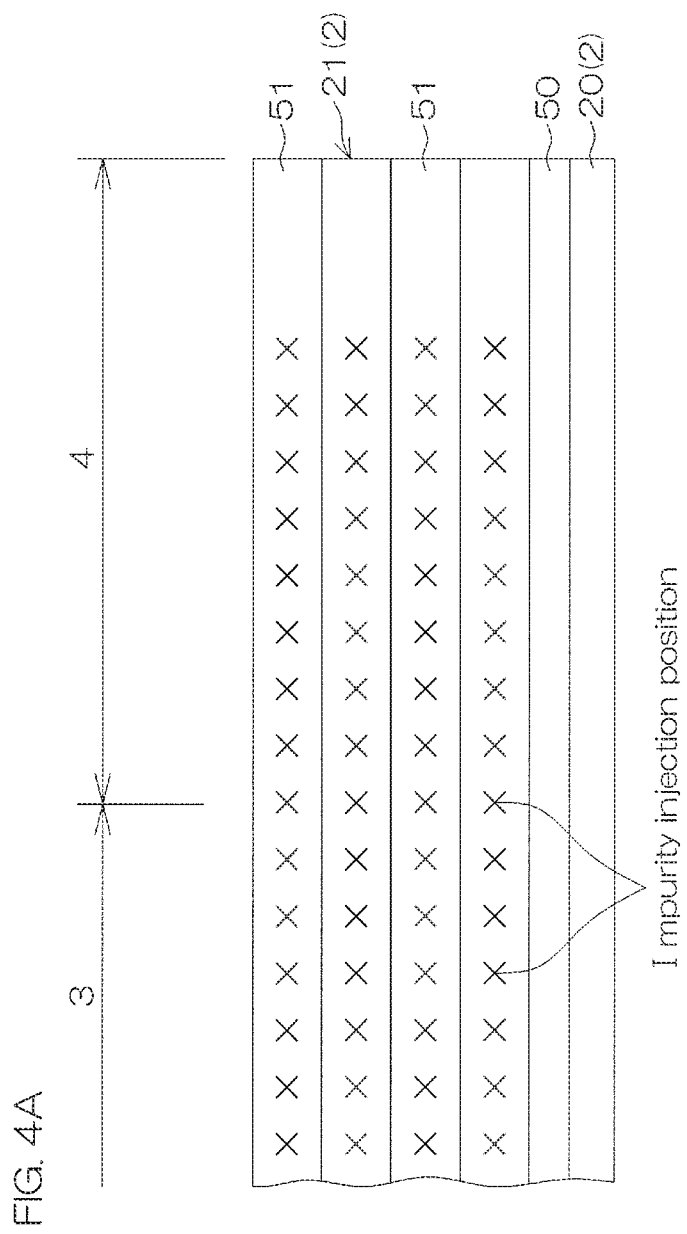

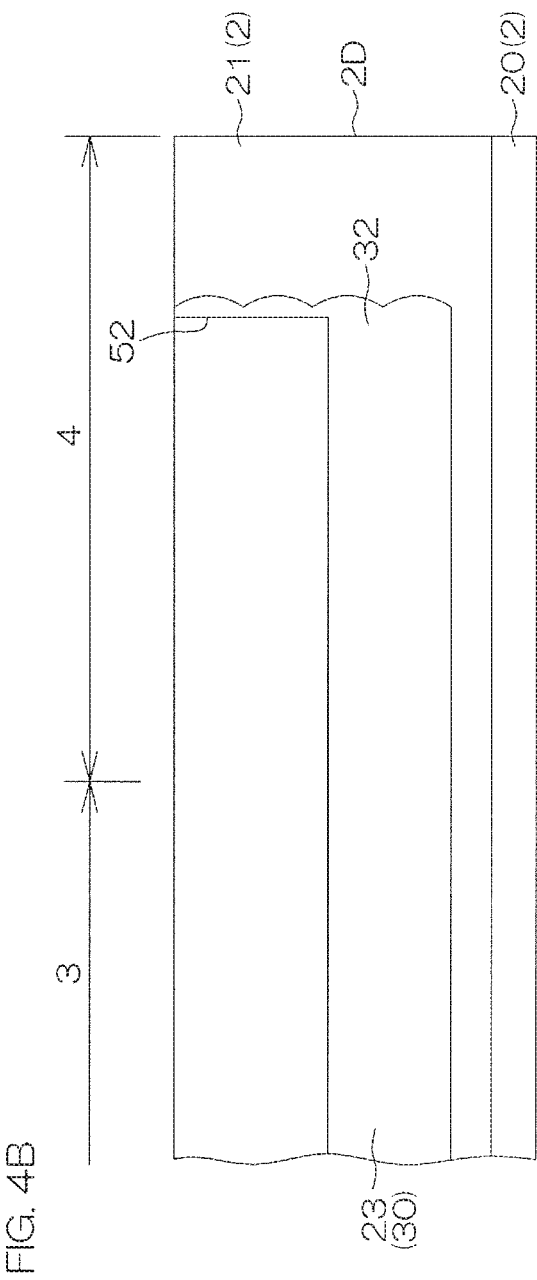

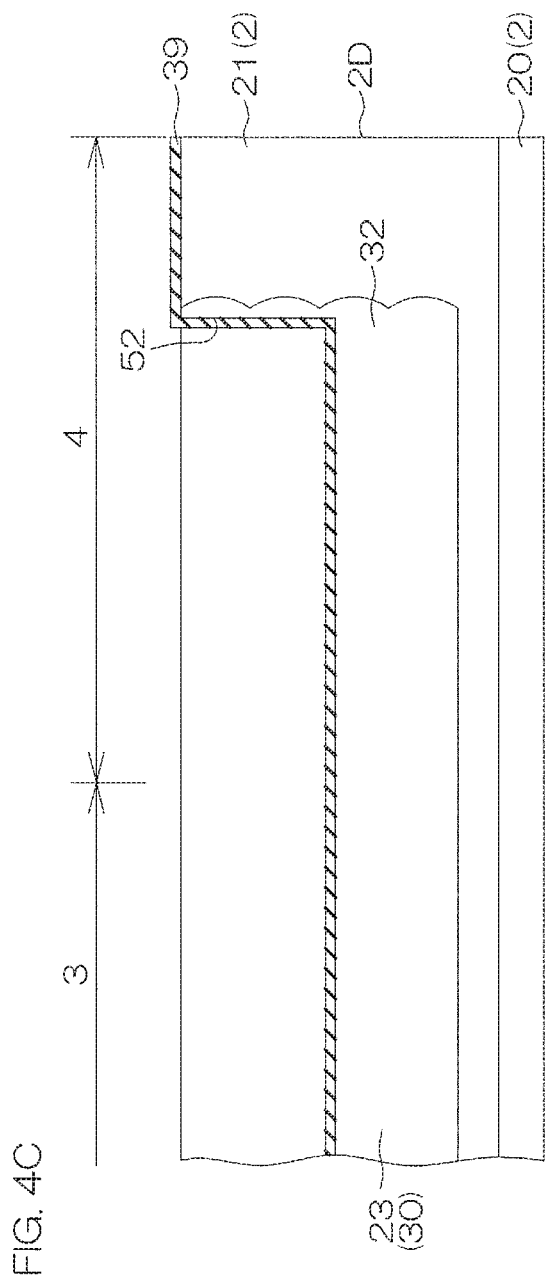

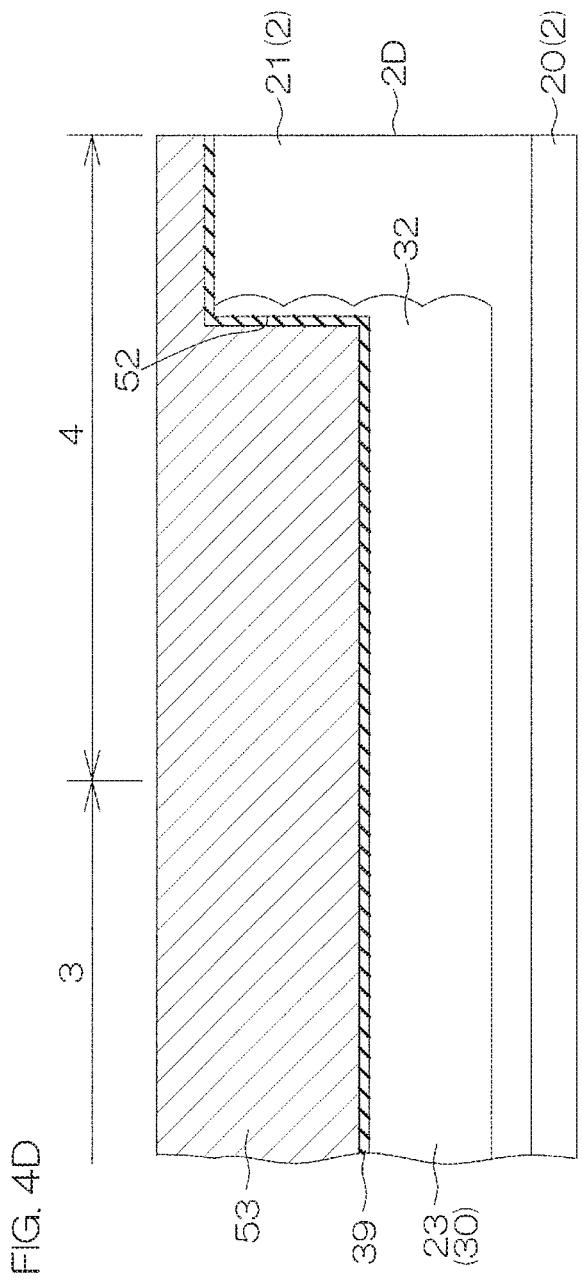

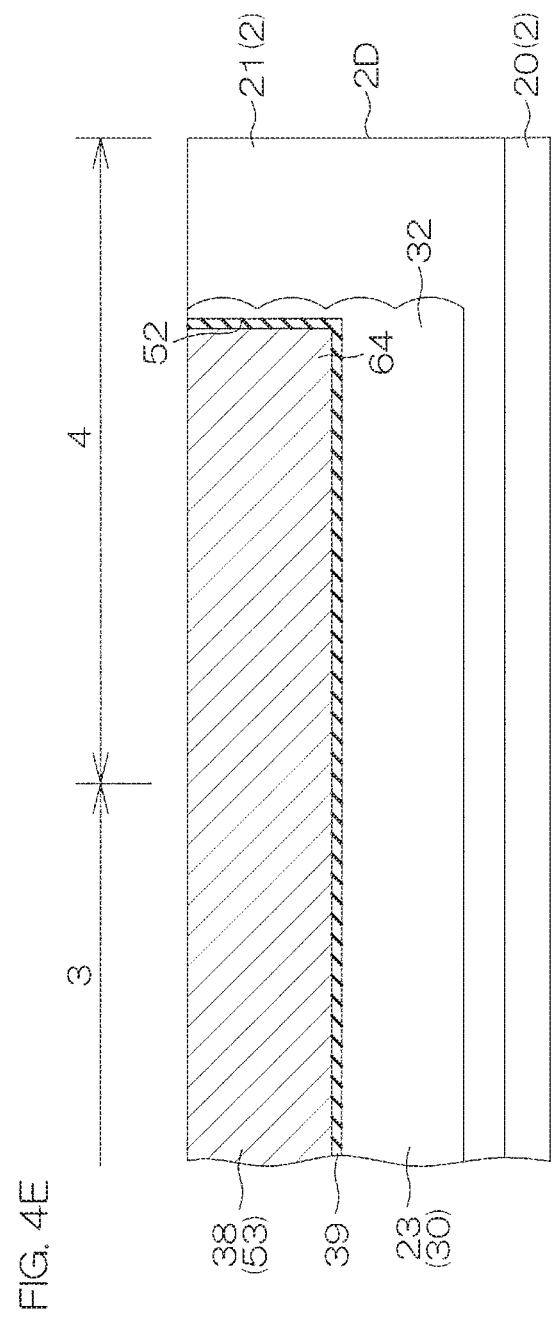

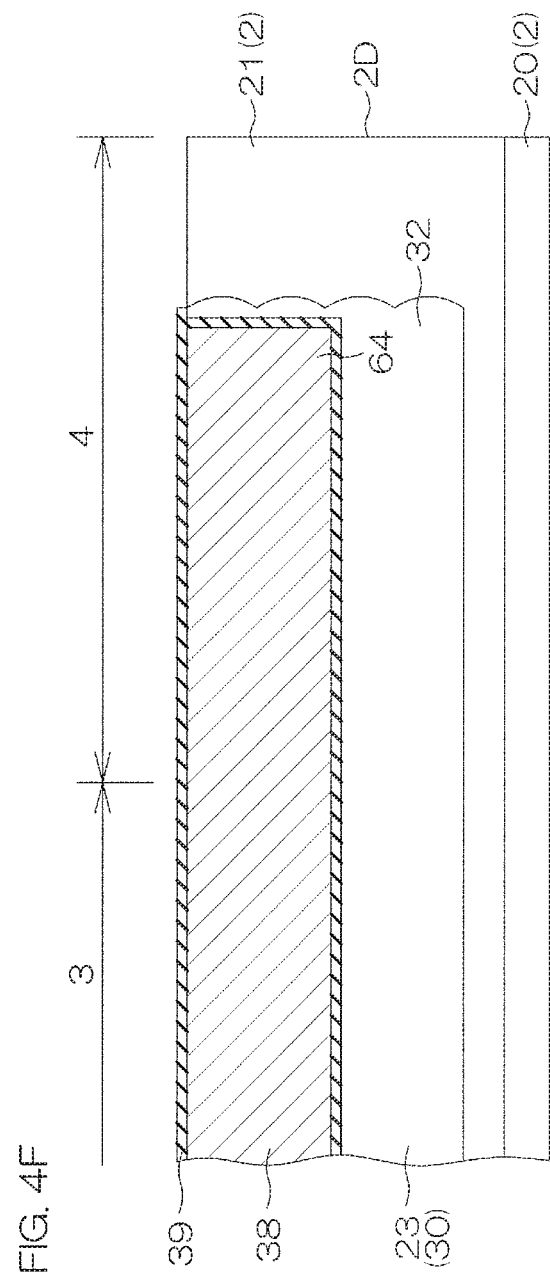

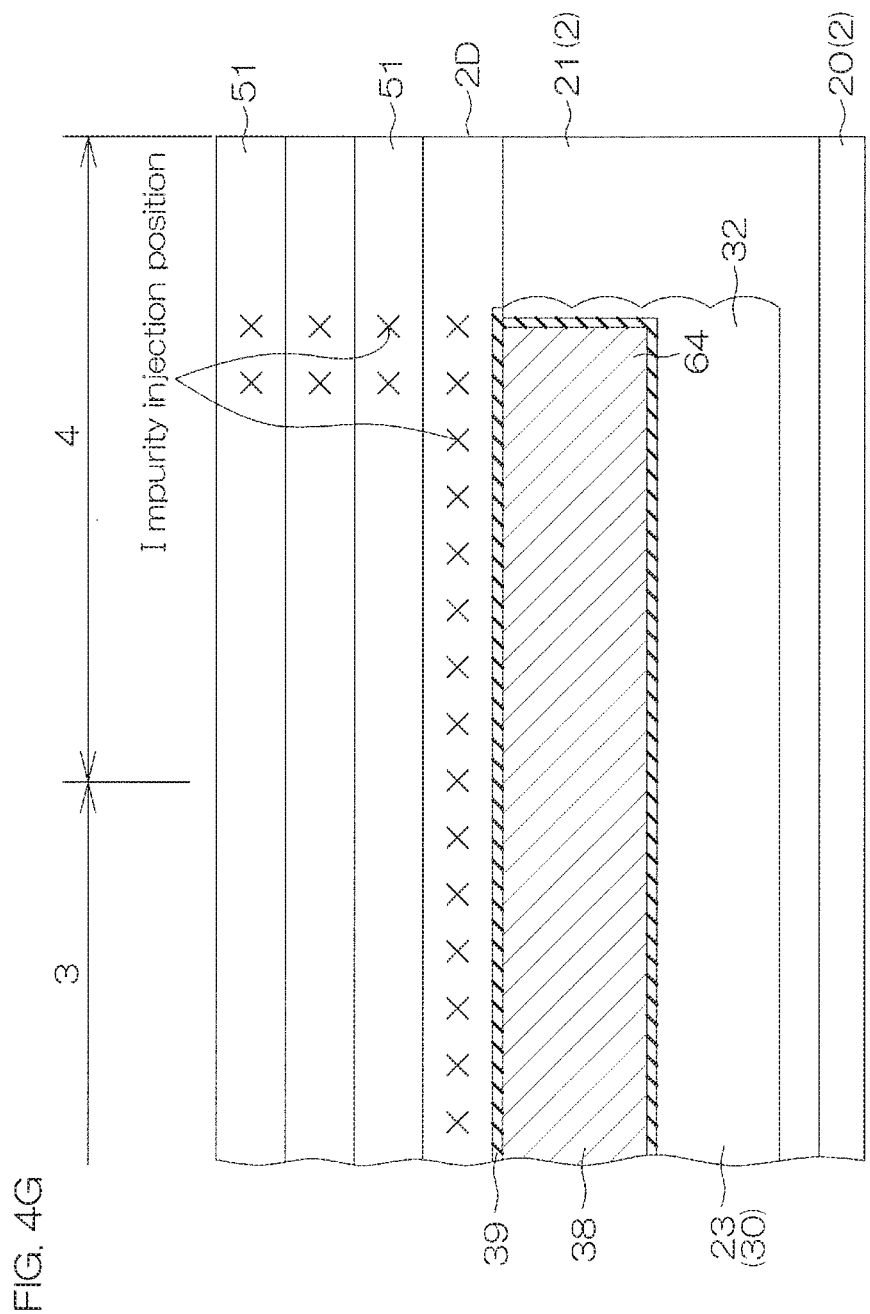

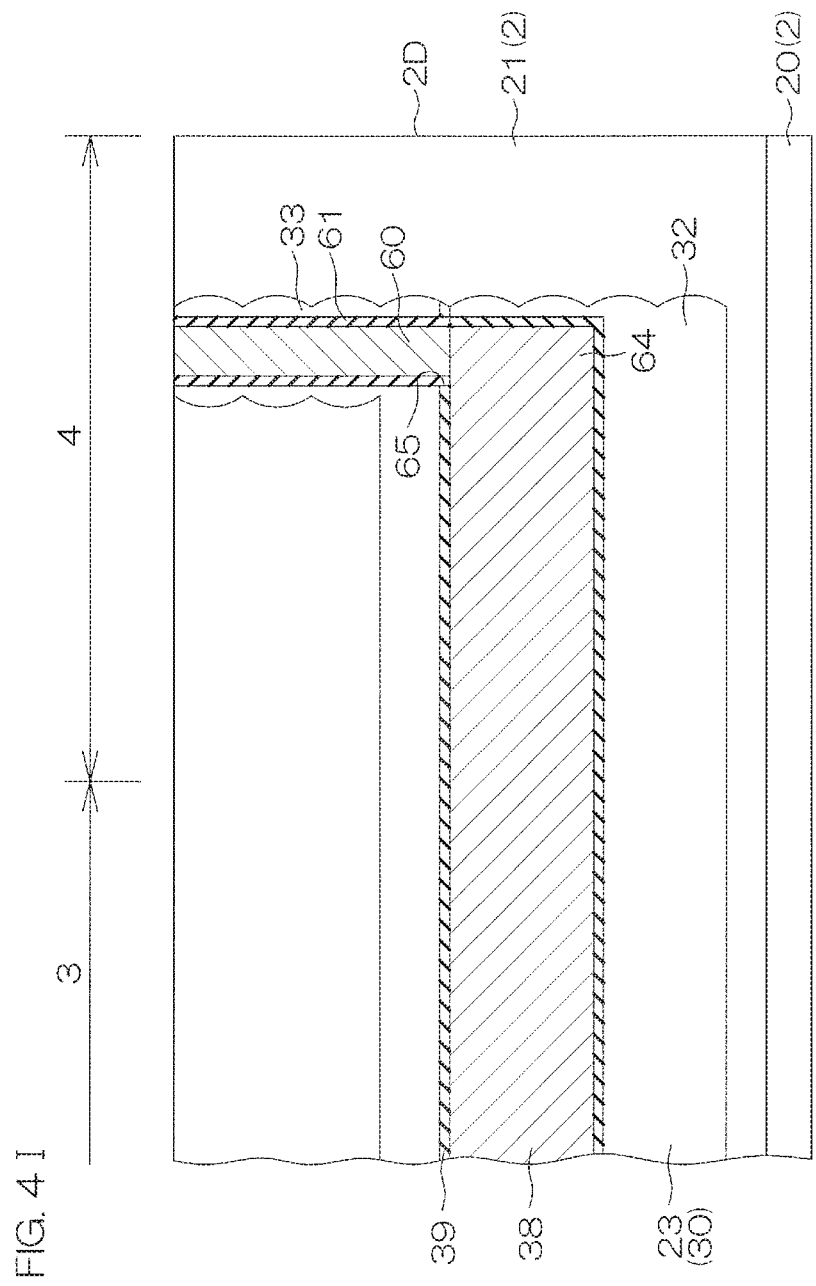

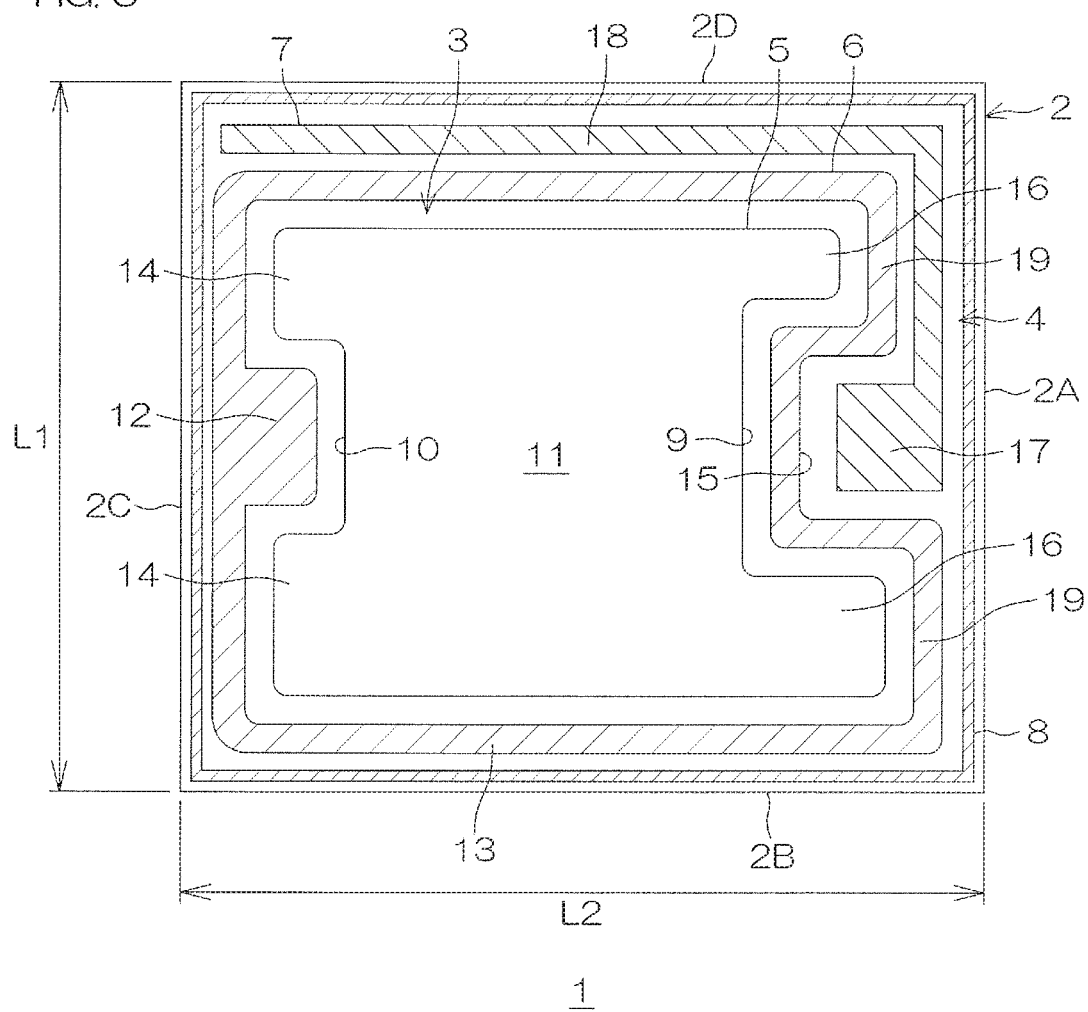

SEMICONDUCTOR DEVICE

CROSS-REFERENCE TO RELATED APPLICATIONS

The present application relates to Japanese Patent Application No. 2018-064794 filed with Japan Patent Office on Mar. 29, 2018, the entire disclosure of which is hereby incorporated by reference.

TECHNICAL FIELD

The present invention relates to a semiconductor device that includes a High Electron Mobility Transistor (HEMT).

BACKGROUND ART

Patent Literature 1 (WO 2010/024433) discloses a semiconductor device which includes: a first base layer; a drain layer provided on a rear surface of the first base layer; a second base layer formed on a surface of the first base layer; a source layer formed on a surface of the second base layer; a gate insulating film disposed on surfaces of the source layer and the second base layer; a gate electrode disposed on the gate insulating film; a column layer formed to oppose the drain layer in the first base layer below the second base layer and the source layer; a drain electrode provided on the drain layer; and a source electrode provided on the source layer and the second base layer.

SUMMARY OF THE INVENTION

A semiconductor device having a super junction structure is required to secure the charge balance between the n type region and the p type region from the viewpoint of appropriately extending the depletion layer to maintain the withstanding voltage. For example, a conventional method of securing the charge balance is to accurately control the impurity concentration of the n type region and the p type region or the width between adjacent cells (cell pitch).

However, it is difficult to accurately control the impurity concentration or the cell pitch, and as a result of placing a high priority on securing the charge balance, other properties (e.g., recovery property) may be restricted.

An object of the present invention is to provide a semiconductor device which is capable of readily controlling the charge balance between a semiconductor layer and a column layer.

Another object of the present invention is to provide a semiconductor device which is capable of both securing the charge balance between a semiconductor layer and a column layer and improving the recovery property.

A semiconductor device according to a preferred embodiment of the present invention includes: a semiconductor layer of a first conductive type having a first surface and a second surface opposite to the first surface; a body region of a second conductive type selectively formed on the first surface of the semiconductor layer; a source region of the first conductive type formed inside the body region; a gate electrode opposing part of the body region via a gate insulating film; a column layer of the second conductive type formed at the second surface side with respect to the body region; an embedded electrode embedded in the column layer such that the embedded electrode is electrically isolated from the column layer; and a first electrode electrically connected to the embedded electrode.

According to the configuration, it is possible to readily control the charge inside the column layer by applying a voltage to the first electrode. Furthermore, since the amount of charge inside the column layer can also be changed by changing the setting of the voltage value to be applied to the first electrode, any error will be smaller when being compared with the case of controlling the impurity concentration or the cell pitch. As a result, as compared with the conventional structure, it is possible to reduce restrictions that are imposed on the impurity concentration of the semiconductor layer, as the base layer of the semiconductor device, or on the width between adjacent cells (cell pitch). As a result, for example, it is possible to provide improved recovery properties because the carrier mobility of the semiconductor layer can be increased by increasing the impurity concentration of the semiconductor layer while securing the charge balance between the semiconductor layer and the column layer.

In the semiconductor device according to the preferred embodiment of the present invention, the embedded electrode may be disposed closer to the first surface of the semiconductor layer from the central portion of the column layer in the depth direction.

According to the configuration, it is possible to separate the lower portion of the column layer, in which the embedded electrode is not present, from a portion of an abrupt voltage drop in the semiconductor layer (e.g., in the vicinity of a parasitic diode caused by a pn junction between the semiconductor layer and the body region). This in turn enables reduction of the influence of the voltage drop. As a result, it is possible to satisfactorily extend the depletion layer, which is generated from the junction interface between the semiconductor layer and the column layer, in the thickness direction of the semiconductor layer.

In the semiconductor device according to the preferred embodiment of the present invention, the semiconductor layer may have an impurity concentration of $1.0 \times 10^{10}$ cm$^{-3}$ to $1.0 \times 10^{16}$ cm$^{-3}$, and the column layer may have an impurity concentration of $1.0 \times 10^{15}$ cm$^{-3}$ to $1.0 \times 10^{19}$ cm$^{-3}$.

The semiconductor layer and the column layer have impurity concentrations within the ranges above, thereby effectively improving recovery properties.

In the semiconductor device according to the preferred embodiment of the present invention, the semiconductor layer may include the active portion and the outer peripheral portion around the active portion; the column layer may extend from the active portion to the outer peripheral portion; the embedded electrode may be embedded in the column layer such that the embedded electrode extends from the active portion to the outer peripheral portion; and the first electrode may include an outer peripheral electrode electrically connected to the embedded electrode in the outer peripheral portion.

The semiconductor device according to the preferred embodiment of the present invention may further include a gate finger formed on the outer peripheral portion and electrically connected to the gate electrode, and the outer peripheral electrode may be disposed outside the gate finger.

The semiconductor device according to the preferred embodiment of the present invention may further include a contact layer extended from the column layer toward the first surface of the semiconductor layer in the outer peripheral portion and exposed to the first surface of the semiconductor layer, and the outer peripheral electrode may be connected to the contact layer on the first surface of the semiconductor layer.

In the semiconductor device according to the preferred embodiment of the present invention, the contact layer may include an embedded contact member embedded in the semiconductor layer and connected to the column layer.

In the semiconductor device according to the preferred embodiment of the present invention, the column layer may include a divided column which is spaced apart from the body region.

In the semiconductor device according to the preferred embodiment of the present invention, the column layer may include a continuous column that is continuous with the body region.

The semiconductor device according to the preferred embodiment of the present invention may include an insulating film which formed inside the column layer such that the insulating film covers the embedded electrode.

In the semiconductor device according to the preferred embodiment of the present invention, the body region may include a plurality of body regions which are extended in a stripe shape.

In the semiconductor device according to the preferred embodiment of the present invention, the semiconductor layer may include a silicon substrate.

BRIEF DESCRIPTION OF THE DRAWINGS

FIG. 3 is a cross-sectional view illustrating a cross section taken along line of FIG. 1.

FIG. 4A to 4J are views each illustrating part of a manufacturing process of the semiconductor device of FIG. 3.

FIG. 5 is a view illustrating a modified example of the semiconductor device.

DETAILED DESCRIPTION OF THE PREFERRED EMBODIMENTS

Hereinafter, referring to the attached drawings, the preferred embodiment of the present invention will be described below in more detail.

Figure 1:
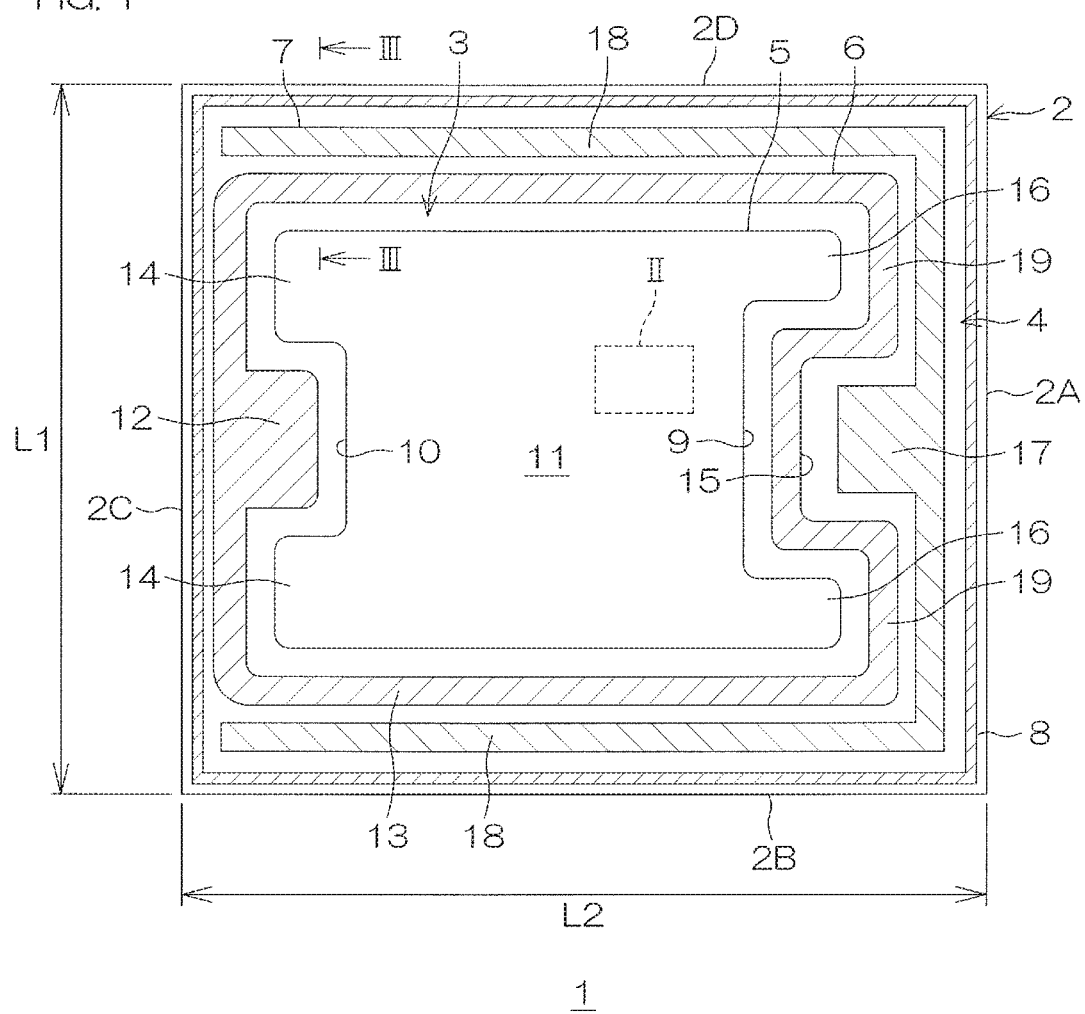
FIG. 1 is a schematic plan view illustrating a semiconductor device according to a preferred embodiment of the present invention.

FIG. 1 is a schematic plan view illustrating a semiconductor device 1 according to a preferred embodiment of the present invention. Note that, in FIG. 1, for the sake of clarity, electrode films 5 to 8 are hatched for illustration.

The semiconductor device 1 includes a semiconductor substrate 2 as an example of a quadrangular semiconductor layer of the present invention in a plan view. The semiconductor substrate 2 may have a length L1 of, e.g., 1.0 mm to 9.0 mm in a first direction (in FIG. 1, a length along a side 2A or 2C of the semiconductor substrate 2) and a length L2 of, e.g., 1.0 mm to 9.0 mm in a second direction orthogonal to the first direction (in FIG. 1, a length along a side 2B or 2D of the semiconductor substrate 2).

In a plan view, the semiconductor substrate 2 includes an active portion 3 in the central area. The active portion 3 is a region where a unit cell 29 to be described later is mainly formed, and when the source-drain of the semiconductor device 1 is in a conducting state (in an ON state), a current flows in a thickness direction of the semiconductor substrate 2. The semiconductor substrate 2 further includes an outer peripheral portion 4 around the active portion 3.

The semiconductor device 1 includes a source electrode film 5 formed d on the active portion 3, a gate electrode film 6 formed on the outer peripheral portion 4, an outer peripheral electrode film 7 as an example of a first electrode of the present invention, and an equipotential ring film 8. These electrode films are separated from each other by patterning a common electrode film.

The source electrode film 5 has a generally quadrangular shape in a plan view which covers most of the active portion 3. At a pair of side portions of the source electrode film 5 that oppose each other (in FIG. 1, the side portion close to the side 2A of the semiconductor substrate 2 and the side portion close to the side 2C), for-pad recesses 9, 10 that are recessed inwardly on the source electrode film 5 are formed. The for-pad recesses 9, 10 are provided to effectively secure a space in which an outer peripheral pad 17 and a gate pad 12 to be described later are disposed, respectively. When the for-pad recesses 9, 10 are compared with each other, the recess 9 for the outer peripheral pad 17 is wider than the recess 10 for the gate pad 12. The source electrode film 5 is selectively covered with a surface protective film 48 (see FIG. 3), and part of the source electrode film 5 is exposed as a source pad 11. For example, a bonding member such as a bonding wire is connected to the source pad 11.

The gate electrode film 6 includes the gate pad 12 and a gate finger 13.

The gate pad 12 is a portion selectively exposed from the surface protective film 48 in the gate electrode film 6 covered with the surface protective film 48 (see FIG. 3). A bonding member such as bonding wire is connected to the gate pad 12. The gate pad 12 is selectively disposed toward one of the pair of sides (in FIG. 1, the side 2A and the side 2C) of the semiconductor substrate 2 that oppose each other. In the preferred embodiment, in a plan view, the gate pad 12 is provided to overlap an inner region of the for-pad recess 10, and is sandwiched with an interval between a pair of projections 14, 14 of the source electrode film 5 that define the sides of the for-pad recess 10 on both sides.

The gate finger 13 is formed in a linear shape such that the gate finger 13 extends from the gate pad 12 along the sides 2A to 2D of the semiconductor substrate 2. In the preferred embodiment, the gate finger 13 is formed in a closed annular shape that surrounds the source electrode film 5. In a plan view, the portion of the gate finger 13 opposing the gate pad 12 (a portion close to the side 2A of the semiconductor substrate 2) is formed such that one side and the other side of the portion of the gate finger 13 in the width direction are placed along the for-pad recess 9. This allows a finger recess 15 defined by part of the gate finger 13 to be formed in the for-pad recess 9. In the preferred embodiment, the finger recess 15 is sandwiched, in a plan view, with an interval between a pair of projections 16, 16 of the source electrode film 5 that define the sides of the for-pad recess 9 on both sides. Note that the gate finger 13 is not necessarily formed in a closed annular shape, but may be shaped to be partially opened. For example, the gate finger 13 may also be adapted such that the opposite side of the gate pad 12 may have an opened shape by following an outer peripheral finger 18 to be described later. Furthermore, the gate finger 13 is covered with the surface protective film 48 (see FIG. 3).

The outer peripheral electrode film 7 includes the outer peripheral pad 17 and the outer peripheral finger 18.

The outer peripheral pad 17 is a portion selectively exposed from the surface protective film 48 in the outer peripheral electrode film 7 covered with the surface protective film 48 (see FIG. 3). A bonding member such as bonding wire is connected to the outer peripheral pad 17. The outer peripheral pad 17 is selectively disposed toward one of the pair of sides (in FIG. 1, the side 2A and the side 2C) of the semiconductor substrate 2 that oppose each other. In the preferred embodiment, in a plan view, the outer peripheral pad 17 is disposed opposite to the gate pad 12 and provided to overlap the inner region of the finger recess 15. This allows the outer peripheral pad 17 to be sandwiched with an interval between a pair of projections 19, 19 of the gate finger 13 that define the sides of the finger recess 15 on both sides. Note that, in FIG. 1, unlike the relationship between the gate pad 12 and the for-pad recess 10, the outer peripheral pad 17 is not provided to overlap the inner region of the for-pad recess 9. However, for example, in a mode in which the gate finger 13 is opened toward the for-pad recess 9, the for-pad recess 9 may be formed to be generally the same in width as the for-pad recess 10, so that the outer peripheral pad 17 may be provided to overlap the inner region of the for-pad recess 9.

The outer peripheral finger 18 is formed in a linear shape from the outer peripheral pad 17 along the sides of the semiconductor substrate 2 (in FIG. 1, the sides 2A, 2B, 2D) outside the gate finger 13. In the preferred embodiment, the outer peripheral finger 18 surrounds the source electrode film 5 and the gate electrode film 6, so that the opposite side of the outer peripheral pad 17 is formed in an opened shape. Note that the outer peripheral finger 18 may also be formed in such a closed annular shape and completely surrounds the source electrode film 5 and the gate electrode film 6. Furthermore, the outer peripheral finger 18 may be the same in width as the gate finger 13, and disposed in parallel to the gate finger 13 to be spaced apart from the gate finger 13. Furthermore, the outer peripheral finger 18 is covered with the surface protective film 48 (see FIG. 3).

The equipotential ring film 8 is formed in such a closed annular shape that surrounds the source electrode film 5, the gate electrode film 6, and the outer peripheral electrode film 7. Furthermore, the equipotential ring film 8 may be narrower in width than the gate finger 13 and the outer peripheral finger 18. Furthermore, the equipotential ring film 8 is covered with the surface protective film 48 (see FIG. 3).

Figure 2:
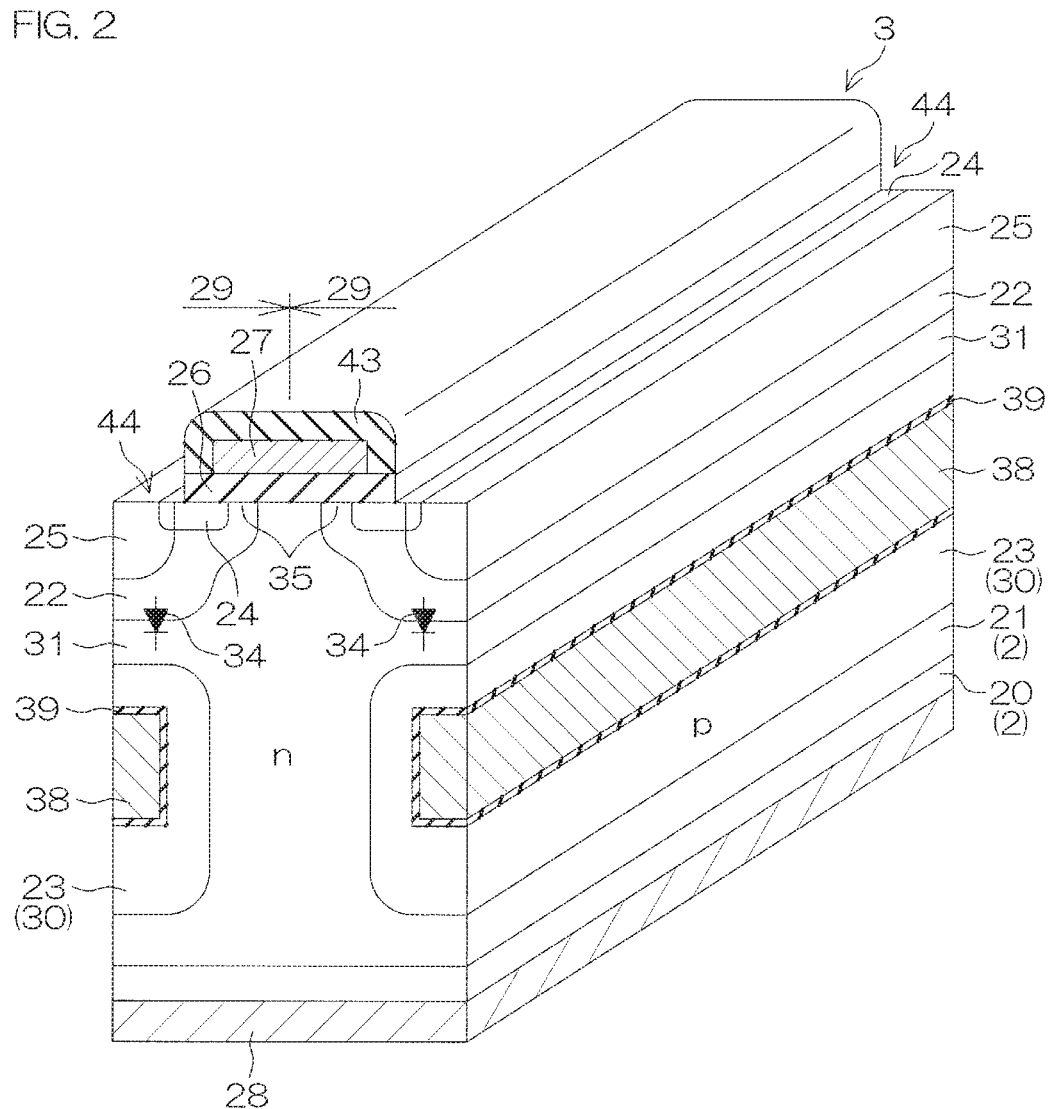
FIG. 2 is a cross-sectional perspective view illustrating a portion of the semiconductor device of FIG. 1 surrounded by broken lines II.

FIG. 2 is a cross-sectional perspective view illustrating a portion of the semiconductor device 1 of FIG. 1 surrounded by broken line II. FIG. 3 is a cross-sectional view illustrating a cross section taken along line of FIG. 1. Note that, in FIG. 2, the structure on the top of an interlayer insulating film 43 is omitted for illustration.

The semiconductor device 1 is an n channel type MOS-FET (Metal Oxide Semiconductor Field Effect Transistor) having a super junction structure.

The semiconductor device 1 includes an $n^+$ type drain layer 20, an $n^-$ type base layer 21, a p type body region 22, a $p^-$ type column layer 23, a $n^+$ type source region 24, a $p^+$ type body contact region 25, a gate insulating film 26, a gate electrode 27, and a drain electrode 28. The semiconductor substrate 2 of FIG. 1 may also have a concept with the $n^+$ type drain layer 20 and the $n^-$ type base layer 21 in combination.

The $n^+$ type drain layer 20 may be formed of an $n^+$ type semiconductor substrate (e.g., silicon substrate). Alternatively, the $n^+$ type drain layer 20 may also be a substrate that is typically employed for transistors such as an SiC substrate and a GaN substrate. The $n^+$ type semiconductor substrate may be a semiconductor substrate that undergoes crystal growth while being doped with an n type impurity. The n type impurity that can be employed may include, e.g., P (phosphorus), As (arsenic), or SB (antimony). Furthermore, the $n^+$ type drain layer 20 has an impurity concentration of, e.g., approximately $1.0 \times 10^{18}$ cm$^{-3}$ to $5.0 \times 10^{20}$ cm$^{-3}$. On the other hand, the $n^+$ type drain layer 20 has a thickness of, e.g., $1.0 \times 10^{18}$ μm to $5.0 \times 10^{20}$ μm.

The $n^-$ type base layer 21 is a semiconductor layer into which an n type impurity is injected. More specifically, the n– type base layer 21 may also be an n type epitaxial layer that is epitaxially grown on the $n^+$ type drain layer 20 while an n type impurity is being injected. As an n type impurity, those mentioned above may be employed. Furthermore, the $n^-$ type base layer 21 has an impurity concentration of, e.g., approximately $1.0 \times 10^{10}$ cm$^{-3}$ to $1.0 \times 10^{16}$ cm$^{-3}$, which is lower than that of the $n^+$ type drain layer 20. Furthermore, the $n^-$ type base layer 21 has a thickness of, e.g., 10 μm to 50 μm.

The p type body region 22 is a semiconductor layer into which a p type impurity is injected. More specifically, the p type body region 22 may also be a semiconductor layer which is formed by ion injection (implantation) of a p type impurity into a surface of the $n^-$ type base layer 21 (an example of a first surface of the present invention). For example, B (boron), Al (aluminum), or Ga (gallium) may be employed as the p type impurity. Furthermore, the p type body region 22 has an impurity concentration of, e.g., approximately $1.0 \times 10^{15}$ cm$^{-3}$ to $1.0 \times 10^{19}$ cm$^{-3}$.

The p type body region 22 is selectively formed on the surface portion of the $n^-$ type base layer 21. In the preferred embodiment, as illustrated in FIG. 2, a plurality of p type body regions 22 are formed in stripe shapes that are parallel to each other, and for example, extended in a direction along the sides 2A, 2C of the semiconductor substrate 2 (see FIG. 1). Note that the plurality of p type body regions 22 may be arranged in a matrix on the surface portion of the $n^-$ type base layer 21. Each p type body region 22 has a width of, e.g., 3 μm to 10 μm. The area that includes each p type body region 22 and the $n^-$ type base layer 21 around the p type body region 22 defines a unit cell 29. That is, according to the layout of FIG. 2, the semiconductor device 1 has a large number of (a plurality of) unit cells 29 that are arranged in a stripe shape in a plan view. Furthermore, in FIG. 2, adjacent unit cells 29 have a width (cell pitch) of, e.g., 5 μm to 20 μm.

Furthermore, as illustrated in FIG. 3, each p type body region 22 is formed across the active portion 3 and the outer peripheral portion 4. The outer peripheral portion 4 of each p type body region 22 has an end portion 36 that is located to be spaced inwardly apart from the side 2D of the semiconductor substrate 2, so that the region between the end portion 36 and the side 2D belongs to the $n^-$ type base layer 21. Furthermore, as illustrated in FIG. 2, each p type body region 22 defines a parasitic diode (body diode) 34 on the interface (pn junction surface) with the $n^-$ type base layer 21.

The $p^-$ type column layer 23 may be a semiconductor layer that is formed by ion injection (implantation) of a p type impurity into the $n^-$ type base layer 21. As a p type impurity, those mentioned above may be employed. Furthermore, the $p^-$ type column layer 23 has an impurity concentration of, e.g., approximately $1.0 \times 10^{15}$ cm$^{-3}$ to $1.0 \times 10^{19}$ cm$^{-3}$, which is lower than that of the p type body region 22.

As illustrated in FIG. 2, the p$^-$ type column layer 23 is formed in an inner region of the p type body region 22 of each unit cell 29. More specifically, the p$^-$ type column layer 23 is formed in a stripe shape in the central area in the width direction of the p type body region 22.

Furthermore, in the preferred embodiment, the p$^-$ type column layer 23 includes divided columns 30 that are formed in the active portion 3 below the p type body region 22 (toward the rear surface of the n$^-$ type base layer 21) to be spaced apart from each other. In this manner, between the p type body region 22 and the divided columns 30, an n$^-$ type divided region 31 which is formed of part of the n$^-$ type base layer 21 is formed. The interval of the divided region 31 (the distance between the lower end of the p type body region 22 and the upper end of the divided columns 30) may be, e.g., 0.5 μm to 5.0 μm).

Referring to FIG. 3, the p$^-$ type column layer 23 is formed across the active portion 3 and the outer peripheral portion 4 below the p type body region 22. This allows the p$^-$ type column layer 23 to further include, in the outer peripheral portion 4, a lead portion 32 that is formed of an extended portion of the divided columns 30 and led outward (toward the side 2A) from the end portion 36 of the p type body region 22 in the outer peripheral portion 4.

From the lead portion 32, a p$^-$ type layer 33 which is extended toward the surface of the n$^-$ type base layer 21 and exposed to the surface of the n$^-$ type base layer 21 is formed. The p$^-$ type layer 33 may be a semiconductor layer which is formed by ion injection (implantation) of a p type impurity into the n$^-$ type base layer 21. As the p type impurity, those mentioned above may be employed. Furthermore, the p$^-$ type layer 33 has an impurity concentration of, e.g., approximately $1.0 \times 10^{15}$ cm$^{-3}$ to $1.0 \times 10^{19}$ cm$^{-3}$, which is the same as that of the p$^-$ type column layer 23.

The p$^-$ type layer 33 is extended in the thickness direction of the n$^-$ type base layer 21 at a position spaced apart from the end portion 36 of the p type body region 22. That is, briefly speaking, a p type impurity region that is integrally formed by the p$^-$ type column layer 23 and the p$^-$ type layer 33 is formed in the outer peripheral portion 4 so as to come around from the lower portion of the p type body region 22 to the side portion, and on both the lower portion and the side portion of the p type body region 22, is spaced apart from the p type body region 22 by the n$^-$ type base layer 21. In this manner, in the direction along the surface of the n$^-$ type base layer 21, a pnp structure which is formed by the p type body region 22, the n$^-$ type base layer 21, and the p$^-$ type layer 33 being sequentially arranged is formed.

Furthermore, the sides of the p$^-$ type column layer 23 and the p$^-$ type layer 33 along the depth direction of the n$^-$ type base layer 21 are a surface of concaves and convexes that periodically undulate along that direction. The number of concaves and convexes typically matches the number of steps of an n type semiconductor layer 51 (FIG. 4A and FIG. 4G) to be described later. Note that, for the sake of clarity, FIG. 2 illustrates the p$^-$ type column layer 23 with the surface of concaves and convexes omitted.

Referring to FIG. 2 and FIG. 3, an embedded electrode 38 is embedded in the p$^-$ type column layer 23. The embedded electrode 38 has a surrounding that is covered with an insulating film 39 to be electrically isolated from the p$^-$ type column layer 23. For example, the embedded electrode 38 may be formed of polysilicon and contain an n type or p type impurity. For example, the insulating film 39 may also be formed of oxidation silicon (SiO$_2$) or nitride silicon (SiN) to have a thickness of approximately 500 to 2000 angstroms.

In a cross section that divides the stripe of the p type body region 22 (FIG. 2), the embedded electrode 38 is formed, in a cross-sectional view, in a pillar shape that extends along the depth direction of the p$^-$ type column layer 23, and has an upper end and a lower end that are spaced apart from the upper end and the lower end of the p$^-$ type column layer 23, respectively. Furthermore, in the preferred embodiment, the embedded electrode 38 has, in a cross-sectional view, a quadrangular shape in a cross section that divides the stripe of the p type body region 22 (FIG. 2).

Meanwhile, in a cross section along the stripe of the p type body region 22 (FIG. 3), the embedded electrode 38 is formed across the active portion 3 and the outer peripheral portion 4 along the p$^-$ type column layer 23, and has an end portion 64 located below the p$^-$ type layer 33 (the end portion 64 opposing the p$^-$ type layer 33 in the thickness direction of the n$^-$ type base layer 21). At the end portion 64 of the embedded electrode 38, an opening 65 that exposes part of the embedded electrode 38 is formed on the insulating film 39.

Furthermore, in the preferred embodiment, the embedded electrode 38 is disposed closer to the surface of the n$^-$ type base layer 21 from the central portion of the p$^-$ type column layer 23 in the depth direction (in the thickness direction of the n$^-$ type base layer 21). More specifically, in the depth direction of the p$^-$ type column layer 23, a region that exceeds at least half of the embedded electrode 38 is formed toward the surface of the n$^-$ type base layer 21 with respect to the central portion of the p$^-$ type column layer 23.

Referring to FIG. 3, an embedded contact 60 is embedded in the p$^-$ type layer 33. Between the embedded contact 60 and the p$^-$ type layer 33, an insulating film 61 is interposed, so that the insulating film 61 insulates between the embedded contact 60 and the p$^-$ type layer 33. The embedded contact 60 is adapted such that the end portion of the n$^-$ type base layer 21 on the rear side is connected to the end portion 64 of the embedded electrode 38 via the opening 65, and the end portion of the n$^-$ type base layer 21 on the surface side is exposed to the surface of the n$^-$ type base layer 21.

For example, the embedded contact 60 is formed of a metal material having an outstanding embedding property such as tungsten or copper. The embedded contact 60 can be formed of a metal material having a low resistance, thereby preventing a delay that is caused when a voltage is applied to the embedded electrode 38. As a matter of course, the embedded contact 60 may also be formed of a conductive material other than metal suitable for embedding (e.g., polysilicon). For example, the insulating film 61 may be formed of silicon oxide (SiO$_2$) or silicon nitride (SiN) which has a thickness of approximately 500 to 2000 angstroms.

Note that, although not illustrated, the structure that allows the embedded contact 60 to draw the contact with the embedded electrode 38 up to the surface of the n$^-$ type base layer 21 is formed on both of the pair of outer peripheral fingers 18 that sandwich the source pad 11. That is, since the embedded contact 60 is disposed on both end portions of the stripe of the unit cell 29, it is possible to efficiently apply a voltage to both one and the other end portions of the embedded electrode 38 in the stripe direction.

The n$^+$ type source region 24 is formed in an inner region of the p type body region 22 in each unit cell 29. In that region, the n$^+$ type source region 24 is selectively formed on the surface portion of the p type body region 22. The n$^+$ type source region 24 may also be formed by selective ion implantation of an n type impurity into the p type body region 22. Examples of n type impurities include those mentioned above. Furthermore, the n⁺ type source region 24 has an impurity concentration of, e.g., approximately $1.0 \times 10^{18}$ cm⁻³ to $5.0 \times 10^{20}$ cm⁻³, which is higher than that of the n⁻ type base layer 21.

The n⁺ type source region 24 is formed inside the p type body region 22 to be located inwardly by a predetermined distance from the peripheral edge of the p type body region 22 (the interface between the p type body region 22 and the n⁻ type base layer 21). Thus, in the surface layer area of the semiconductor layer including, e.g., the n⁻ type base layer 21 and the p type body region 22, the surface portion of the p type body region 22 is interposed between the n⁺ type source region 24 and the n⁻ type base layer 21, so that the interposed surface portion provides a channel region 35.

In the preferred embodiment, the n⁺ type source region 24 is formed in a stripe shape to be formed in a region outside the side of the p⁻ type column layer 23. The channel region 35 has a stripe shape depending on the shape of the n⁺ type source region 24.

The p⁺ type body contact region 25 is formed in a region immediately above the p⁻ type column layer 23. In that region, the p⁺ type body contact region 25 is selectively formed on the surface portion of the p type body region 22. The p⁺ type body contact region 25 may also be formed by selective ion implantation of a p type impurity into the p type body region 22. Examples of p type impurities include those mentioned above. Furthermore, the p⁺ type body contact region 25 has an impurity concentration of, e.g., approximately $5.0 \times 10^{17}$ cm⁻³ to $1.0 \times 10^{19}$ cm⁻³, which is higher than that of the p type body region 22.

The p⁺ type body contact region 25 is extended through the n⁺ type source region 24 up to an intermediate position in the p type body region 22 toward the n⁺ type drain layer 20.

In the preferred embodiment, the p⁺ type body contact region 25 is formed in a stripe shape. Referring to FIG. 3, the end portion 37 of each p⁺ type body contact region 25 is disposed inside the active portion 3 at a position to be spaced apart inwardly from the end portion 36 of the p type body region 22. This allows the region between the end portion 37 and the end portion 36 of the p type body region 22 to belong to the p type body region 22.

Furthermore, referring to FIG. 3, on the surface portion of the n⁻ type base layer 21, an end face side p type region 42 that is exposed on an end face of the n⁻ type base layer 21 (a side of the semiconductor substrate 2) and the surface of the n⁻ type base layer 21 is formed. The end face side p type region 42 is formed in the same step as that of the p type body region 22 and has the same depth. Thus, the end face side p type region 42 has an impurity concentration of e.g., approximately $1.0 \times 10^{15}$ cm⁻³ to $1.0 \times 10^{19}$ cm⁻³, which is the same as that of the p type body region 22.

For example, the gate insulating film 26 may be formed of silicon oxide film, silicon nitride film, silicon oxynitride, hafnium oxide film, alumina film, or tantalum oxide film. Referring to FIG. 2, the gate insulating film 26 covers at least the surface of the p type body region 22 in the channel region 35. In the preferred embodiment, the gate insulating film 26 covers the surface of part of the n⁺ type source region 24, the channel region 35, and the n⁻ type base layer 21. Briefly speaking, the gate insulating film 26 is formed in a pattern that has an opening in the p⁺ type body contact region 25 of each unit cell 29 and the inner edge region of the n⁺ type source region 24 that is continuous with the p⁺ type body contact region 25. Furthermore, referring to FIG. 3, the gate insulating film 26 is extended from the active portion 3 to the outer peripheral portion 4 and selectively formed in the outer peripheral portion 4.

The gate electrode 27 is formed to oppose the channel region 35 via the gate insulating film 26. For example, the gate electrode 27 may be formed of polysilicon that is reduced in resistance by injecting an impurity.

Referring to FIG. 2, in the active portion 3, the gate electrode 27 is formed in the generally same pattern as that of the gate insulating film 26, covering the surface of the gate insulating film 26. That is, the gate electrode 27 is disposed above part of the n⁺ type source region 24, the channel region 35, and the surface of the n⁻ type base layer 21. Briefly speaking, the gate electrode 27 is formed in a pattern that has an opening in the p⁺ type body contact region 25 of each unit cell 29 and the inner edge region of the n⁺ type source region 24 that is continuous with the p⁺ type body contact region 25. That is, the gate electrode 27 is formed to control a plurality of unit cells 29 in common. In this manner, the planar gate structure is constructed.

Meanwhile, referring to FIG. 3, in the outer peripheral portion 4, the gate electrode 27 has a contact portion 40 that is located to oppose a region between the end portion 37 of the p⁺ type body contact region 25 and the end portion 36 of the p type body region 22. The gate electrode film 6 (the gate finger 13) that serves as an external electrode is connected to the contact 40. Furthermore, in the outer peripheral portion 4, an equipotential ring electrode 41 that is formed of the same material as that of the gate electrode 27 is provided on the gate insulating film 26. The equipotential ring electrode 41 is disposed on a region between the p⁻ type layer 33 and the end face side p type region 42 so as not to overlap the p⁻ type layer 33 and the end face side p type region 42.

The interlayer insulating film 43 is formed on the n⁻ type base layer 21 and the interlayer insulating film 43 covers the gate electrode 27 and the equipotential ring electrode 41. For example, the interlayer insulating film 43 is formed of an insulation material such as silicon oxide film, silicon nitride film, or TEOS (tetraethoxysilane).

A contact hole 44 to expose the p⁺ type body contact region 25 and the n⁺ type source region 24 of each unit cell 29, a contact hole 45 to expose the contact portion 40 of the gate electrode 27, a contact hole 46 to expose the p⁻ type layer 33, and a contact hole 47 to expose the equipotential ring electrode 41 are formed in the interlayer insulating film 43. These contact holes 44 to 47 penetrate the interlayer insulating film 43 and the gate insulating film 26.

The source electrode film 5 is formed of aluminum or other metals. Referring to FIG. 3, the source electrode film 5 is formed to selectively cover the surface of the interlayer insulating film 43 and to be embedded in the contact hole 44. This allows the source electrode film 5 to be ohmically connected to the n⁺ type source region 24. Thus, the source electrode film 5 is connected in parallel to a plurality of unit cells 29, so that all the current flowing through the plurality of unit cells 29 flows into the source electrode film 5. Furthermore, the source electrode film 5 is ohmically connected to the p⁺ type body contact region 25 of each unit cell 29 via the contact hole 44 to stabilize the potential of the p type body region 22.

The gate electrode film 6 is formed of aluminum or other metals. Referring to FIG. 3, the gate electrode film 6 is formed to selectively cover the surface of the interlayer insulating film 43 and to be embedded in the contact hole 45. This allows the gate electrode film 6 to be ohmically connected to the contact portion 40 of the gate electrode 27.

The outer peripheral electrode film 7 is formed of aluminum or other metals. Referring to FIG. 3, the outer peripheral electrode film 7 is formed to selectively cover the surface of the interlayer insulating film 43 and to be embedded in the contact hole 46. This allows the outer peripheral electrode film 7 to be ohmically connected to the embedded contact 60.

The equipotential ring film 8 is formed of aluminum or other metals. Referring to FIG. 3, the equipotential ring film 8 is formed to selectively cover the surface of the interlayer insulating film 43 and to be embedded in the contact hole 47. This allows the equipotential ring film 8 to be ohmically connected to the equipotential ring electrode 41.

The surface protective film 48 is formed on the outermost surface of the semiconductor substrate 2 and the surface protective film 48 covers the electrode films 5 to 8. For example, the surface protective film 48 is formed of an insulation material such as silicon nitride film or polyimide film. Referring to FIG. 3, a pad opening 49 to expose part of the source electrode film 5 as the source pad 11 is formed in the surface protective film 48. Note that, although not illustrated, pad openings to respectively expose part of the gate electrode film 6 and the outer peripheral electrode film 7 as the gate pad 12 and the outer peripheral pad 17, are formed on the surface protective film 48. Meanwhile, the finger portions of the gate electrode film 6 and the outer peripheral electrode film 7 (the gate finger 13 and the outer peripheral finger 18) are covered with the surface protective film 48. The equipotential ring film 8 is entirely covered with the surface protective film 48.

The drain electrode 28 is formed of aluminum or other metals. The drain electrode 28 is formed to be in contact with the rear surface of the $n^+$ type drain layer 20. This allows the drain electrode 28 to be connected in parallel to a plurality of unit cells 29, so that all the current flowing through the plurality of unit cells 29 flows into the drain electrode 28.

With the drain electrode 28 at a high potential side and the source electrode film 5 at a low potential side, connecting a direct current power supply between the source electrode film 5 and the drain electrode 28 will cause a reverse bias to be applied to the parasitic diode 34. At this time, if a control voltage lower than a predetermined threshold voltage is applied to the gate electrode 27, no current path is formed between the drain and the source. That is, the semiconductor device 1 is turned into an OFF state. Meanwhile, applying a control voltage equal to or greater than a threshold voltage to the gate electrode 27 will cause electrons to be attracted to the surface of the channel region 35 to forme an inverted layer (channel). This causes electrical conduction between the $n^+$ type source region 24 and the $n^-$ type base layer 21. That is, a current path is formed sequentially from the source electrode film 5 through the $n^+$ type source region 24, the inverted layer of the channel region 35, and the $n^-$ type base layer 21 to the drain electrode 28. That is, the semiconductor device 1 is turned into an ON state.

FIGS. 4A to 4J are views that illustrate the manufacturing process of the semiconductor device 1 in the order of steps. Note that FIGS. 4A to 4J correspond to the cross-sectional view of FIG. 3.

In order to manufacture the semiconductor device 1, first, referring to FIG. 4A, an initial base layer 50 is formed on the $n^+$ type drain layer 20. Then, on the initial base layer 50, a plurality of n type semiconductor layers 51 are deposited in layers by multi-epitaxial growth to repeat a step of defining an n type semiconductor layer 51 while a p type impurity is being selectively injected to the position at which the $p^-$ type column layer 23 is to be formed. This allows the plurality of n type semiconductor layers 51 and the initial base layer 50 to be integrated with each other to form the $n^-$ type base layer 21.

Next, annealing (1000° C. to 1200° C.) is conducted for drive diffusion of the p type impurity in the plurality of n type semiconductor layers 51. Referring to FIG. 4B, this allows the $p^-$ type column layer 23 to be formed in the $n^-$ type base layer 21. Next, the $p^-$ type column layer 23 is selectively removed (e.g., by dry etching) in a pattern corresponding to the embedded electrode 38 to thereby form a trench 52 in the $p^-$ type column layer 23.

Next, referring to FIG. 4C, the insulating film 39 is formed, e.g., by a CVD method so as to cover the inner surface of the trench 52. More specifically, in FIG. 3, the portions of the insulating film 39 so as to cover the bottom and the sides of the embedded electrode 38 are formed prior to the portion that covers the upper surface of the embedded electrode 38. The insulating film 39 is formed on the inner surface of the trench 52 and also on the $n^-$ type base layer 21. Note that the insulating film 39 may also be formed by thermal oxidation of the inner surface of the trench 52.

Next, referring to FIG. 4D, a material 53 of the embedded electrode 38 is embedded, e.g., by a CVD method in the trench 52. The material 53 completely fills the trench 52 and is also formed on the $n^-$ type base layer 21.

Next, referring to FIG. 4E, an unnecessary portion of the material 53 (a portion outside the trench 52) is selectively removed, e.g., by etch back to form the embedded electrode 38. Subsequently, the portion of the insulating film 39 outside the trench 52 is also removed.

Next, referring to FIG. 4F, the remainder of the insulating film 39 (the portion to cover the upper surface of the embedded electrode 38) is formed, e.g., by a CVD method in the $n^-$ type base layer 21.

Next, referring to FIG. 4G, a plurality of n type semiconductor layers 51 are deposited in layers by multi-epitaxial growth to repeat a step of defining an n type semiconductor layer 51 while a p type impurity is being selectively injected into the remainder of the $p^-$ type column layer 23 (a portion closer to the surface of the $n^-$ type base layer 21 from the embedded electrode 38) and into the position at which the $p^-$ type layer 33 is to be formed so as to cover the embedded electrode 38.

Figure 4H:
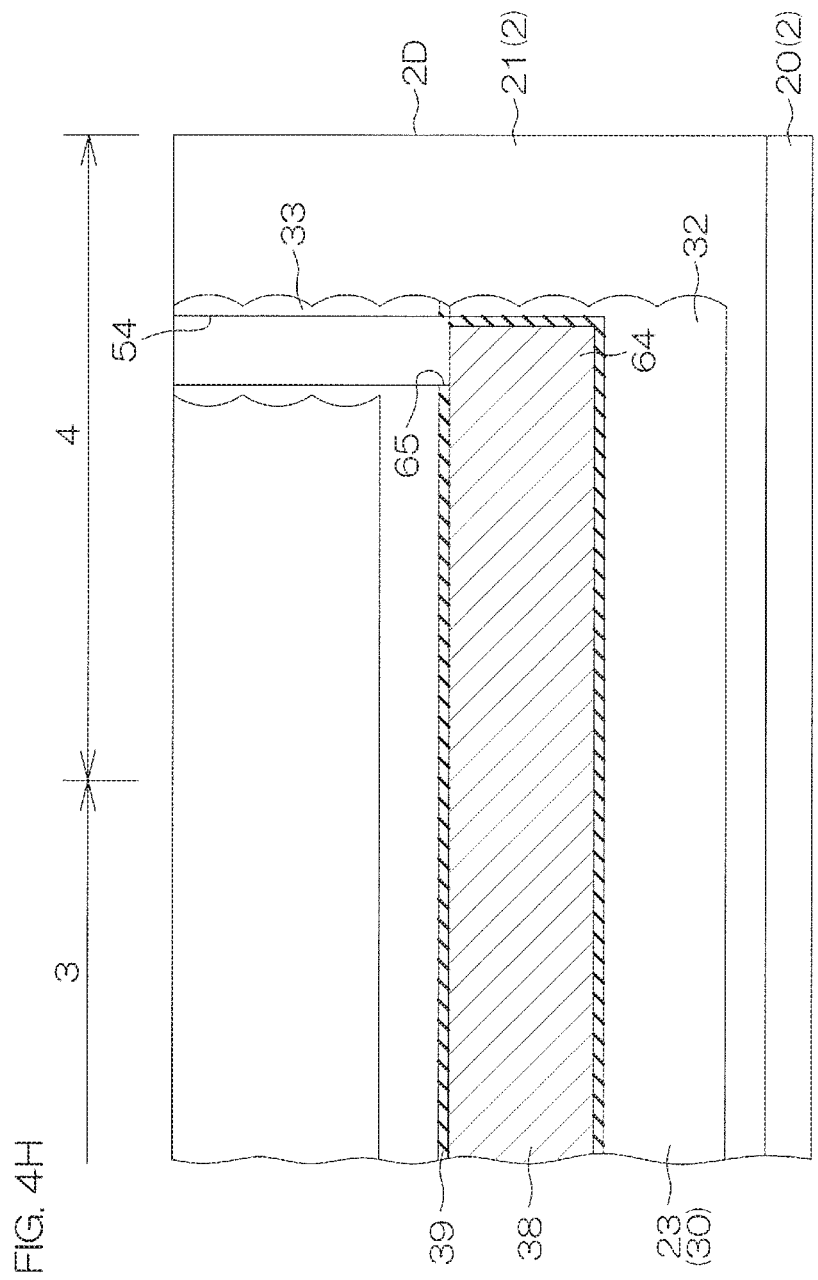

Next, annealing (1000° C. to 1200° C.) is conducted for drive diffusion of the p type impurity in the plurality of n type semiconductor layers 51. Referring to FIG. 4H, this allows (the remainder of) the $p^-$ type column layer 23 and the $p^-$ type layer 33 to be formed in the $n^-$ type base layer 21 at the same time. Then, the $p^-$ type layer 33 is selectively removed (e.g., by dry etching) in a pattern corresponding to the embedded contact 60 to thereby form a trench 54 in the $p^-$ type layer 33. After the trench 54 is formed, the opening 65 is formed in the insulating film 39.

Next, referring to FIG. 4I, the insulating film 61 is formed, e.g., by a CVD method so as to cover the inner surface of the trench 54. Note that the insulating film 61 may also be formed by thermal oxidation of the inner surface of the trench 54. Then, the embedded contact 60 is embedded, e.g., by a CVD method in the trench 54.

Figure 4J:
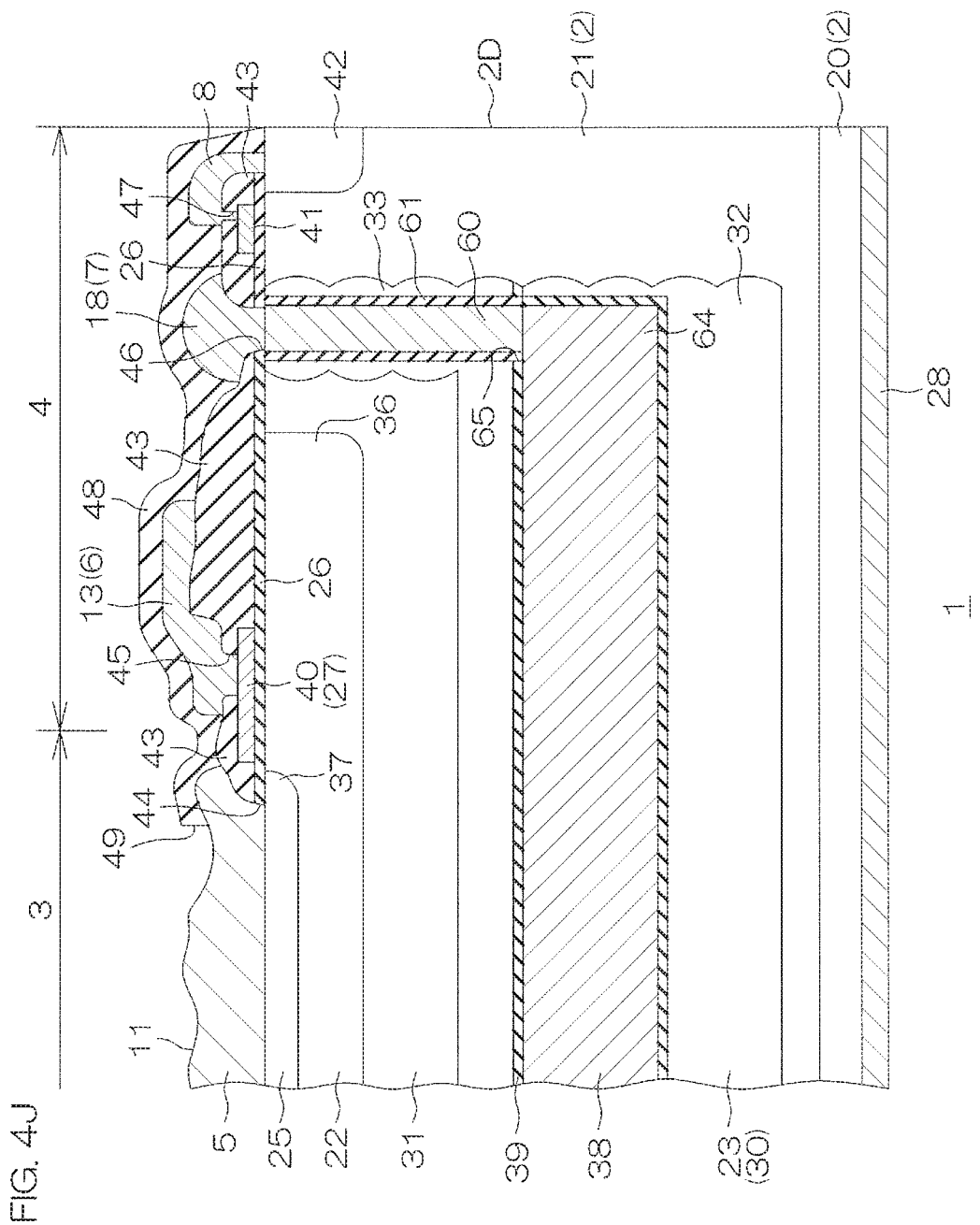

Next, referring to FIG. 4J, the gate insulating film 26 is formed on the $n^-$ type base layer 21. The gate insulating film 26 may be formed by thermal oxidation of the semiconductor crystalline surface. Furthermore, the gate electrode 27 and the equipotential ring electrode 41 are formed on the gate insulating film 26. The gate electrode 27 and the equipotential ring electrode 41 may also be formed, e.g., by defining a polysilicon film, which is reduced in resistance by being doped with impurity, on the entire surface, and thereafter, by selectively etching the polysilicon film by photolithography.

Furthermore, referring to FIG. 4J, the interlayer insulating film 43 is formed so as to cover the gate electrode 27 and the equipotential ring electrode 41, so that the contact holes 44 to 47 are formed by photolithography in the interlayer insulating film 43. Next, the source electrode film 5, the gate electrode film 6, the outer peripheral electrode film 7, and the equipotential ring film 8 are formed on the interlayer insulating film 43.

Next, referring to FIG. 4J, the surface protective film 48 is formed so as to cover the source electrode film 5, the gate electrode film 6, the outer peripheral electrode film 7, and the equipotential ring film 8, so that the pad opening 49 is formed by photolithography in the surface protective film 48. In this manner, the MIS structure of the semiconductor device 1 is formed.

Thereafter, the drain electrode 28 is formed on the rear surface of the $n^+$ type drain layer 20, thereby providing the semiconductor device 1 of FIG. 1 to FIG. 3.

As described above, according to the semiconductor device 1, the embedded electrode 38 is embedded in the $p^-$ type column layer 23 via the insulating film 39. The embedded electrode 38 is electrically connected to the outer peripheral electrode film 7 via the embedded contact 60. Applying a voltage to the outer peripheral electrode film 7 makes it possible to apply the voltage to the embedded electrode 38 via the embedded contact 60. This enables readily controlling the charge on the negative side of the $p^-$ type column layer 23. That is, even if the $n^-$ type base layer 21 opposing the $p^-$ type column layer 23 has a relatively high impurity concentration, it is possible to readily secure the charge balance by controlling the charge on the negative side of the $p^-$ type column layer 23.

Moreover, since the amount of charge inside the $p^-$ type column layer 23 can also be changed by changing the setting of the voltage value to be applied to the outer peripheral electrode film 7, any error will be smaller when being compared with the case of controlling the impurity concentration of the $n^-$ type base layer 21 and the $p^-$ type column layer 23 or the pitch of the unit cells 29. As a result, as compared with the conventional structure, it is possible to reduce restrictions that are imposed on the impurity concentration of the $n^-$ type base layer 21 or the pitch of the unit cells 29. As a result, for example, it is possible to provide improved recovery properties because the carrier mobility of the $n^-$ type base layer 21 (in the preferred embodiment, the hole mobility) can be increased by increasing the impurity concentration of the $n^-$ type base layer 21 while securing the charge balance between the $n^-$ type base layer 21 and the $p^-$ type column layer 23.

Furthermore, in the preferred embodiment, the embedded electrode 38 is disposed closer to the surface of the $n^-$ type base layer 21 from the central portion of the $p^-$ type column layer 23 in the depth direction (in the thickness direction of the $n^-$ type base layer 21). This enables separating the lower portion of the $p^-$ type column layer 23, in which the embedded electrode 38 is not present, from a portion of an abrupt voltage drop in the semiconductor substrate 2 (e.g., in the vicinity of the parasitic diode 34). This in turn enables reduction of the influence of the voltage drop. As a result, it is possible to satisfactorily extend the depletion layer, which is generated from the junction interface between the $n^-$ type base layer 21 and the $p^-$ type column layer 23, in the thickness direction of the $n^-$ type base layer 21.

In the foregoing, the preferred embodiment of the present invention has been described; however, the present invention may also be carried out in other modes.

For example, in the aforementioned preferred embodiment, the outer peripheral finger 18 is formed on both sides of the source pad 11 (the side 2B and the side 2D of the semiconductor substrate 2) so as to sandwich the source pad 11; however, referring to FIG. 5, the outer peripheral finger 18 may also be formed only on one side of the source pad 11.

Figure 6:
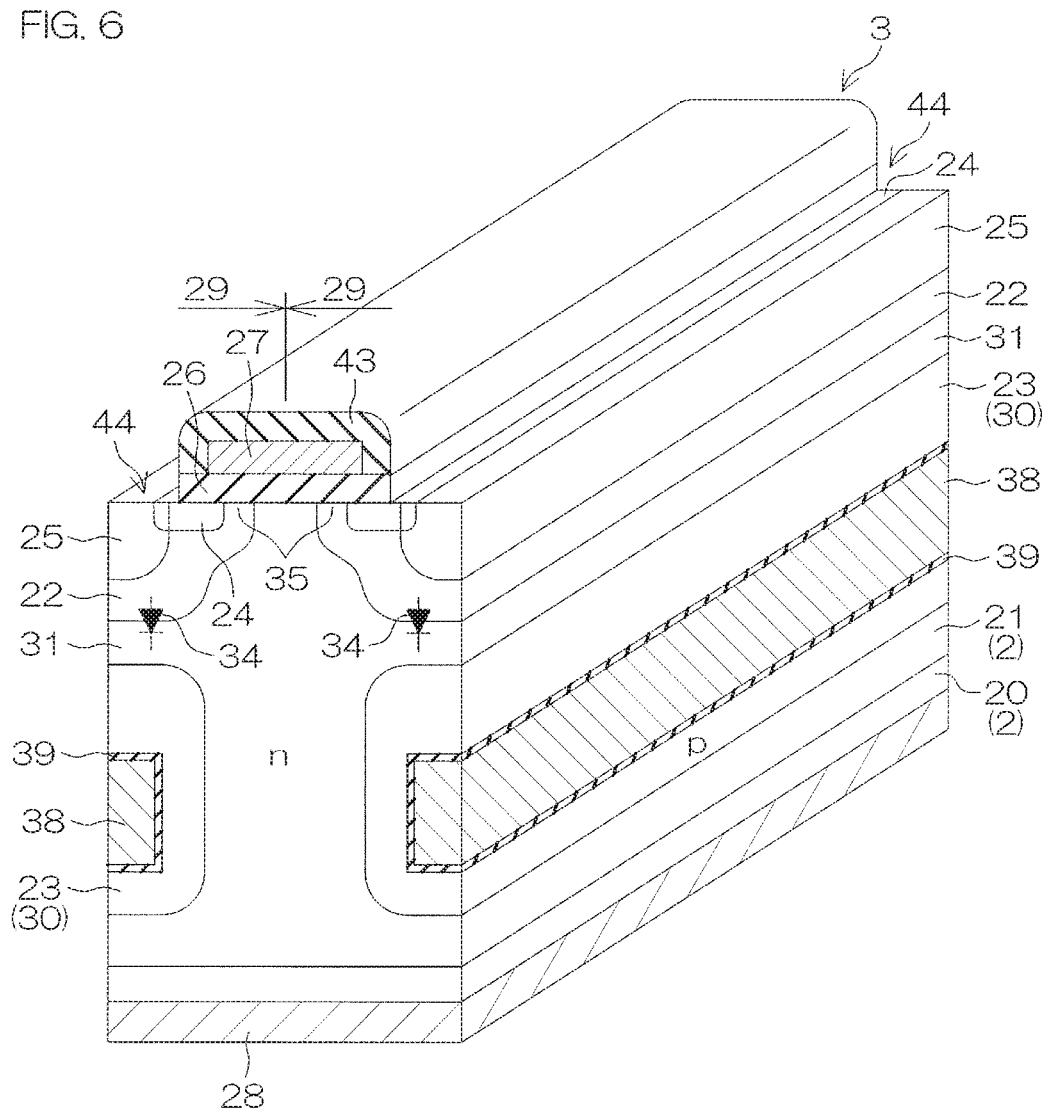
FIG. 6 is a view illustrating a modified example of the semiconductor device.

Furthermore, in the aforementioned preferred embodiment, the embedded electrode 38 is disposed closer to the surface of the $n^-$ type base layer 21 from the central portion of the $p^-$ type column layer 23 in the depth direction; however, referring to FIG. 6, the embedded electrode 38 may also be disposed closer to the rear surface of the $n^-$ type base layer 21 from the central portion of the $p^-$ type column layer 23 in the depth direction.

Figure 7:
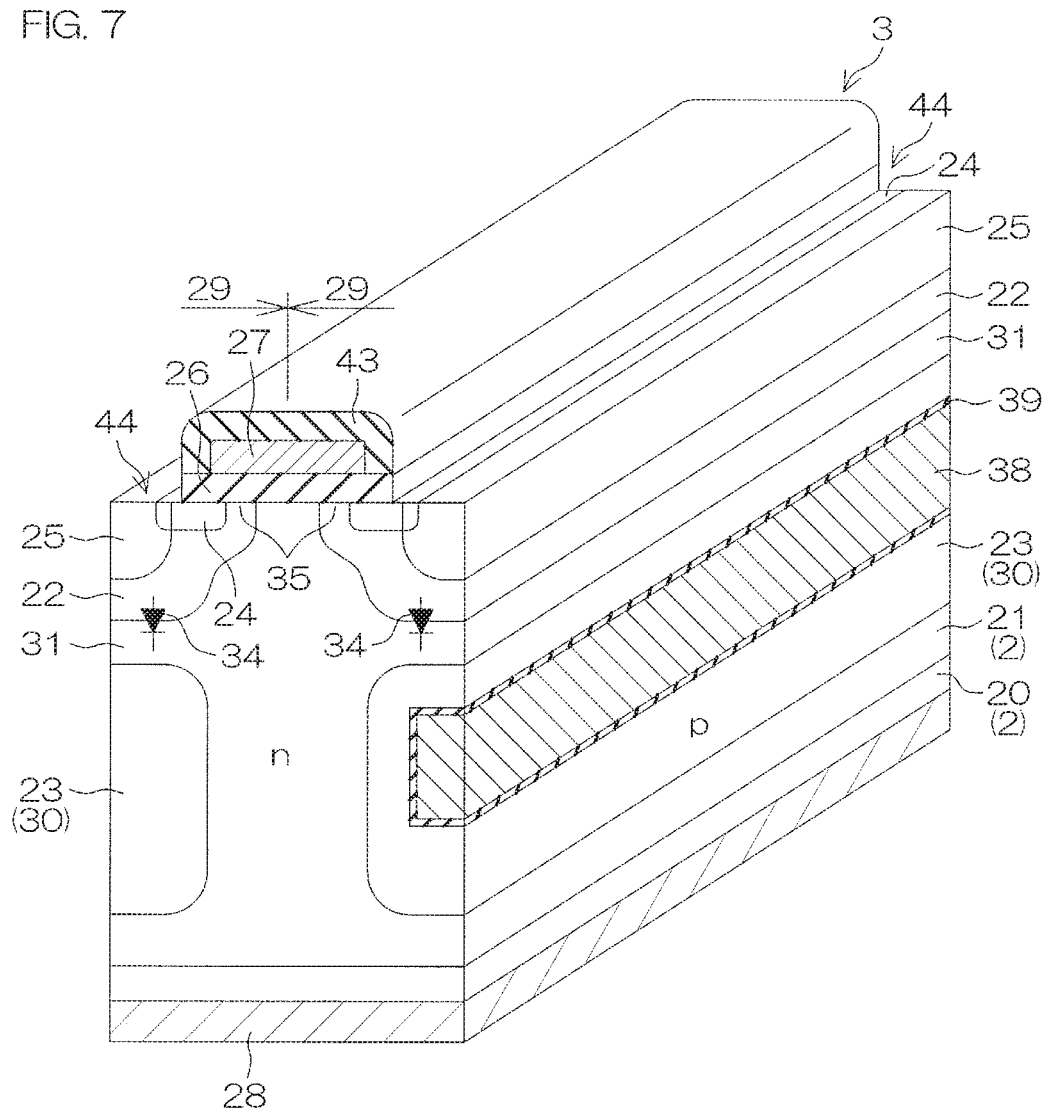
FIG. 7 is a view illustrating a modified example of the semiconductor device.

Furthermore, in the aforementioned preferred embodiment, the embedded electrode 38 is formed in all the $p^-$ type column layers 23; however, referring to FIG. 7, the embedded electrode 38 may also be formed in part of the $p^-$ type column layers 23, whereas the embedded electrode 38 may not be formed in the other $p^-$ type column layers 23.

Figure 8:
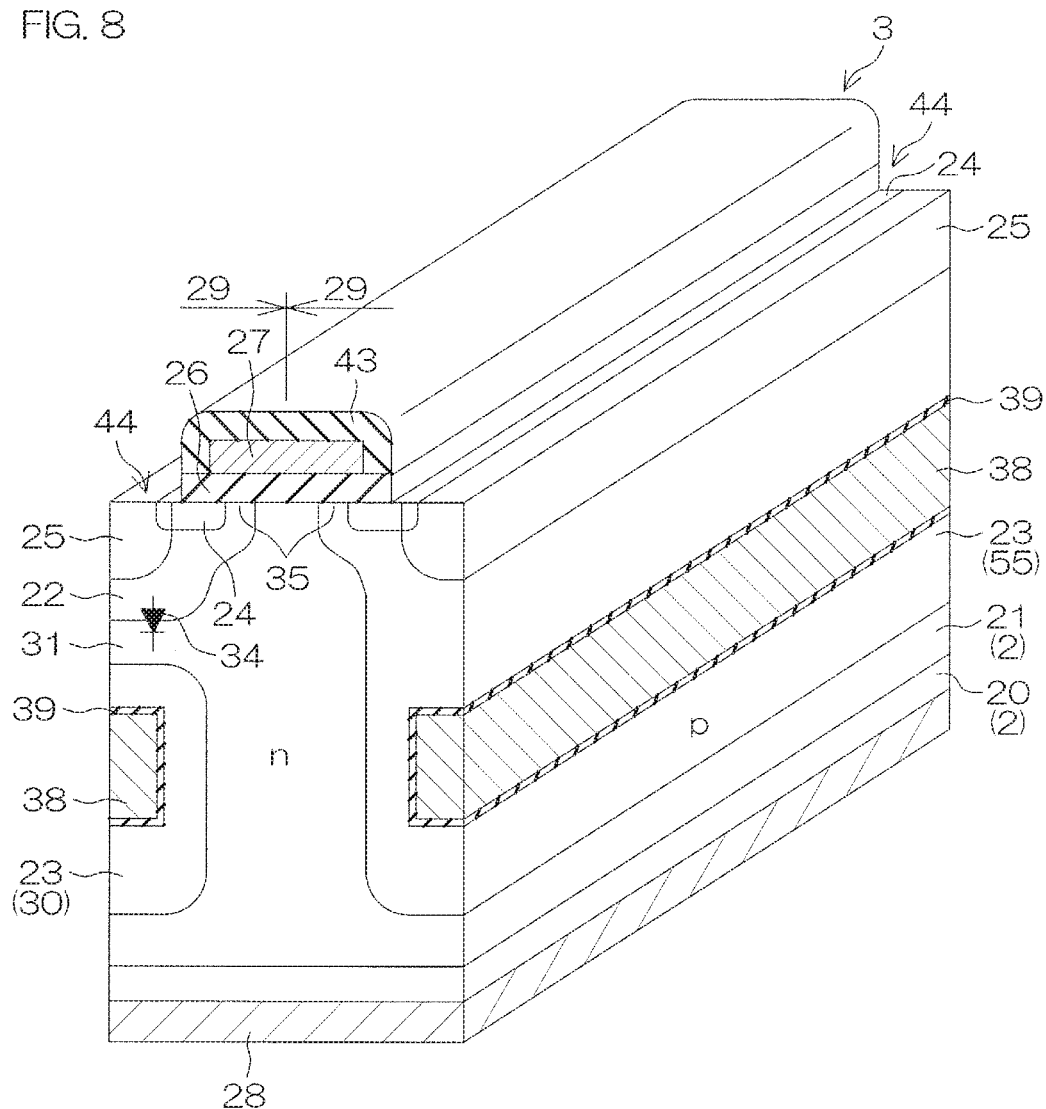
FIG. 8 is a view illustrating a modified example of the semiconductor device.
Figure 9:
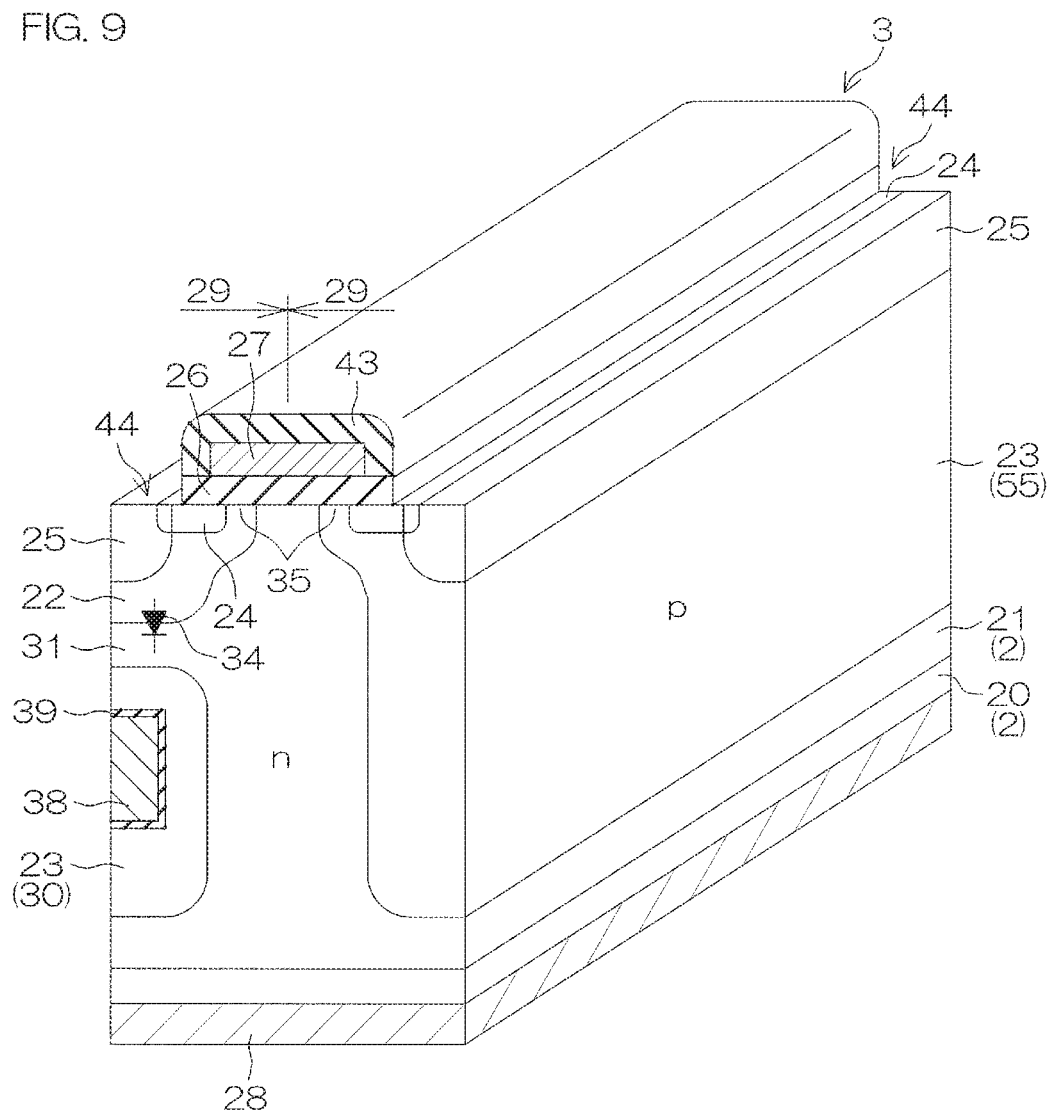
FIG. 9 is a view illustrating a modified example of the semiconductor device.
Figure 10:
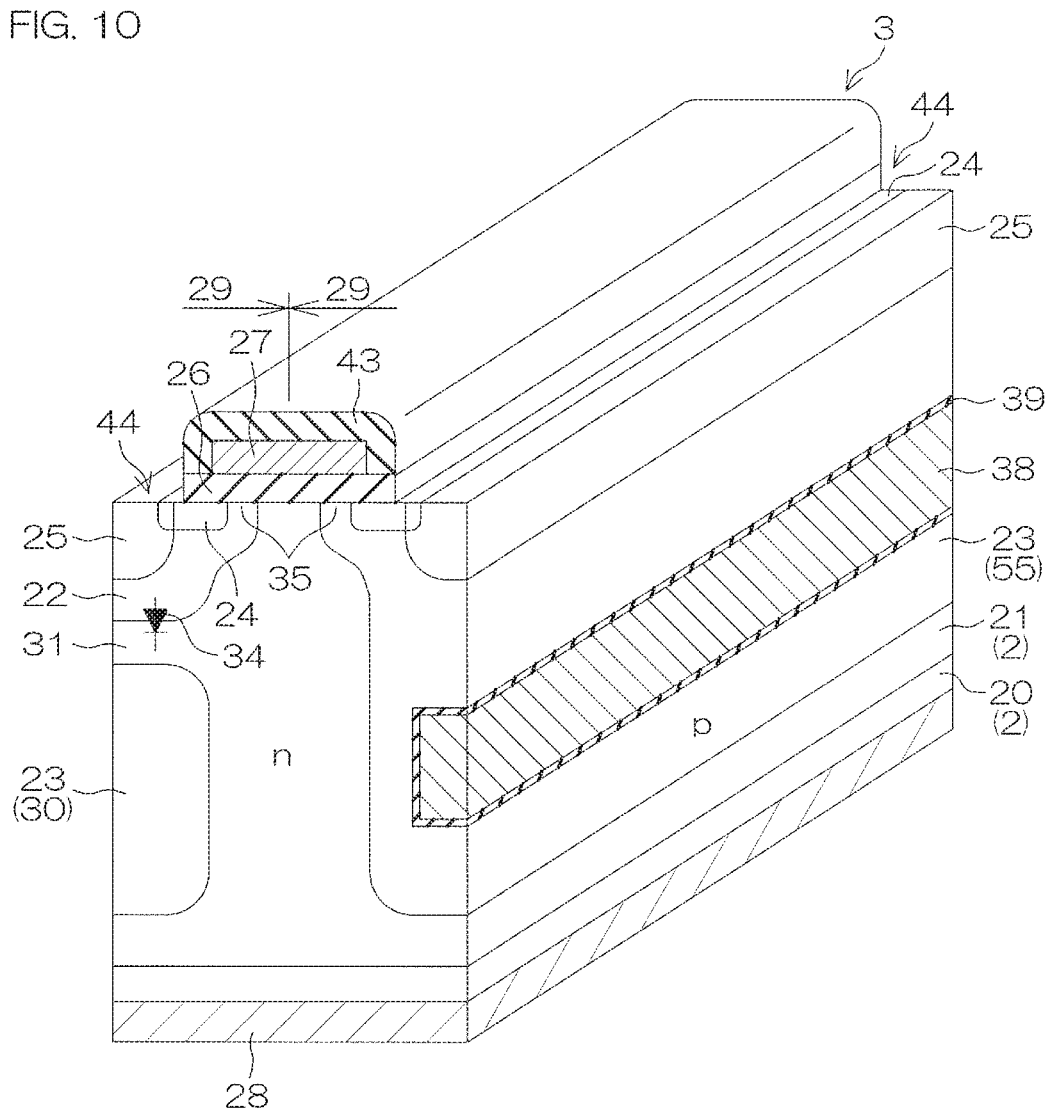
FIG. 10 is a view illustrating a modified example of the semiconductor device.

Furthermore, in the aforementioned preferred embodiment, the $p^-$ type column layer 23 is the divided column 30 that is formed by being spaced apart from the p type body region 22; however, referring to FIG. 8, the $p^-$ type column layer 23 may also include a continuous column 55 that is continuously formed with the lower portion of the p type body region 22. In FIG. 8, the divided columns 30 and the continuous column 55 are illustrated one for each; however, for example, the divided columns 30 and the continuous column 55 may be alternately arranged in a direction orthogonal to the stripe direction. Furthermore, in this case, referring to FIG. 9, the embedded electrode 38 may be selectively formed only in the divided column 30, or alternatively, referring to FIG. 10, the embedded electrode 38 may also be selectively formed only in the continuous column 55.

Furthermore, in the aforementioned preferred embodiment, the contact to the embedded electrode 38 is secured by the embedded contact 60; however, the contact is not particularly limited as long as the structure is which the contact is being drawn up to the surface of the $n^-$ type base layer 21 from the embedded electrode 38 is employed.

Furthermore, in the aforementioned preferred embodiment, the $p^-$ type column layer 23 is formed by multi-epitaxial growth; however, for example, the $p^-$ type column layer 23 may also be formed by defining a deep trench in the $n^-$ type base layer 21 to embed the p type semiconductor layer in the deep trench.

Furthermore, the unit cell 29 may have a planar gate structure as employed in the aforementioned preferred embodiment or a trench gate structure.

It is also acceptable to employ a configuration in which the electrical conduction type of each semiconductor portion of the semiconductor device 1 is inverted. For example, in the semiconductor device 1, the p type portion may be of an n type and the $n^-$ type portion may be of a p type.

Other than specifically described above, a number of modifications of the design are possible within the scope of the appended claims.

What is claimed is:

1. A semiconductor device comprising:
a semiconductor layer of a first conductive type, the semiconductor layer having a first surface and a second surface opposite to the first surface;
a body region of a second conductive type, the body region selectively formed on the first surface of the semiconductor layer;
a source region of the first conductive type, the source region formed inside the body region;
a gate electrode opposing part of the body region with a gate insulating film between the gate electrode and the part of the body region;
a column layer of the second conductive type formed at a side of the second surface with respect to the body region;
an embedded electrode embedded in the column layer such that the embedded electrode is electrically isolated from the column layer; and
a first electrode electrically connected to the embedded electrode.

2. The semiconductor device according to claim 1 wherein
the embedded electrode is disposed closer to the first surface of the semiconductor layer from a central portion of the column layer in a depth direction.

3. The semiconductor device according to claim 1 wherein
the semiconductor layer has an impurity concentration of $1.0 \times 10^{10}$ cm$^{-3}$ to $1.0 \times 10^{16}$ cm$^{-3}$; and
the column layer has an impurity concentration of $1.0 \times 10^{15}$ cm$^{-3}$ to $1.0 \times 10^{19}$ cm$^{-3}$.

4. The semiconductor device according to claim 1, wherein
the semiconductor layer includes an active portion and an outer peripheral portion around the active portion;
the column layer extends from the active portion to the outer peripheral portion;
the embedded electrode is embedded in the column layer such that the embedded electrode extends from the active portion to the outer peripheral portion; and
the first electrode includes an outer peripheral electrode electrically connected to the embedded electrode in the outer peripheral portion.

5. The semiconductor device according to claim 4, further comprising:
a gate finger formed on the outer peripheral portion and electrically connected to the gate electrode, wherein
the outer peripheral electrode is disposed outside the gate finger.

6. The semiconductor device according to claim 4, further comprising:
a contact layer extending from the column layer toward the first surface of the semiconductor layer in the outer peripheral portion and exposed to the first surface of the semiconductor layer, wherein
the outer peripheral electrode is connected to the contact layer on the first surface of the semiconductor layer.

7. The semiconductor device according to claim 6, wherein
the contact layer includes an embedded contact member embedded in the semiconductor layer and connected to the column layer.

8. The semiconductor device according to claim 1, wherein
the column layer includes a divided column that is spaced apart from the body region.

9. The semiconductor device according to claim 1, wherein
the column layer includes a continuous column that is continuous with the body region.

10. The semiconductor device according to claim 1, comprising:
an insulating film formed inside the column layer such that the insulating film covers the embedded electrode.

11. The semiconductor device according to claim 1, wherein
the body region includes a plurality of body regions which are extended in a stripe shape.

12. The semiconductor device according to claim 1, wherein
the semiconductor layer includes a silicon substrate.

* * * * *